(12) United States Patent
Chen et al.

(10) Patent No.: US 10,757,756 B2
(45) Date of Patent: Aug. 25, 2020

(54) MANAGEMENT FRAMES FOR RATE ADAPTATION BY ENHANCED DIRECTIONAL MULTI-GIGABIT (EDMG) STATIONS IN MILLIMETER WAVE (MMWAVE) NETWORKS

(71) Applicant: Intel IP Corporation, Santa Clara, CA (US)

(72) Inventors: Cheng Chen, Hillsboro, OR (US); Carlos Cordeiro, Portland, OR (US); Oren Kedem, Modiin Maccabim-Reut (IL)

(73) Assignee: Intel IP Corporation, Santa Clara, CA (US)

( * ) Notice: Subject to any disclaimer, the term of this patent is extended or adjusted under 35 U.S.C. 154(b) by 41 days.

(21) Appl. No.: 16/220,751

(22) Filed: Dec. 14, 2018

(65) Prior Publication Data
US 2019/0268972 A1 Aug. 29, 2019

Related U.S. Application Data

(60) Provisional application No. 62/635,021, filed on Feb. 26, 2018.

(51) Int. Cl.
*H04W 88/10* (2009.01)
*H04L 5/14* (2006.01)
(Continued)

(52) U.S. Cl.
CPC ....... *H04W 88/10* (2013.01); *H03M 13/1102* (2013.01); *H04B 17/336* (2015.01);
(Continued)

(58) Field of Classification Search
CPC .......... H04L 5/14; H04W 52/02; H04B 7/0617
See application file for complete search history.

(56) References Cited

U.S. PATENT DOCUMENTS

| 2013/0010844 A1* | 1/2013 | Annini ................ H04L 1/0015 |
| | | 375/219 |
| 2014/0029453 A1* | 1/2014 | Trainin ................ H04W 24/10 |
| | | 370/252 |

(Continued)

OTHER PUBLICATIONS

"Discovery Assistance for 802.11ay normative text", doc.:IEEE 802.11-18/817r0, (May 2018), 13 pgs.
(Continued)

*Primary Examiner* — Melanie Jagannathan
(74) *Attorney, Agent, or Firm* — Schwegman Lundberg & Woessner, P.A.

(57) ABSTRACT

Embodiments of an enhanced directional multi-gigabit (EDMG) station (STA), access point (AP), and method of communication are generally described herein. The EDMG STA may receive, from the AP, a Link Measurement Request Frame that includes a request for information for time division duplexing (TDD) rate adaptation. The EDMG STA may transmit a Link Measurement Response Frame that includes a Directional Multi Gigabit (DMG) Link Margin element that includes a Rate Adaption Control parameter. The DMG Link Margin element may be configurable to include one or more optional fields for the TDD rate adaptation and transmit power control. The Rate Adaptation Control parameter may indicate: a number of space time streams (STSs) for which information is included in the DMG Link Margin element; and whether the DMG Link Margin element includes the one or more optional fields.

9 Claims, 9 Drawing Sheets

(51) Int. Cl.
    *H04L 1/00*     (2006.01)
    *H04L 27/26*     (2006.01)
    *H04W 24/10*     (2009.01)
    *H04L 1/16*     (2006.01)
    *H03M 13/11*     (2006.01)
    *H04B 17/336*     (2015.01)
    *H04B 7/0413*     (2017.01)
    *H04W 84/12*     (2009.01)
    *H04L 5/00*     (2006.01)

(52) U.S. Cl.
    CPC .......... *H04L 1/0003* (2013.01); *H04L 1/1614* (2013.01); *H04L 5/1469* (2013.01); *H04L 27/2607* (2013.01); *H04W 24/10* (2013.01); *H04B 7/0413* (2013.01); *H04L 5/0007* (2013.01); *H04W 84/12* (2013.01)

(56) References Cited

U.S. PATENT DOCUMENTS

| | | | | |
|---|---|---|---|---|
| 2015/0319700 | A1* | 11/2015 | Oteri | H04W 52/28 455/127.1 |
| 2016/0198393 | A1* | 7/2016 | Li | H04W 48/12 370/338 |
| 2016/0227489 | A1* | 8/2016 | Oteri | H04W 52/243 |
| 2017/0111143 | A1* | 4/2017 | Seok | H04L 27/0008 |
| 2018/0242299 | A1* | 8/2018 | Xin | H04L 27/2602 |
| 2019/0190754 | A1* | 6/2019 | Kim | H04L 5/0007 |
| 2019/0305996 | A1* | 10/2019 | Handte | H04L 5/0044 |
| 2019/0341973 | A1* | 11/2019 | Kasher | H04B 7/0417 |
| 2019/0373537 | A1* | 12/2019 | Trainin | H04W 16/28 |
| 2020/0092812 | A1* | 3/2020 | Bang | H04L 5/14 |

OTHER PUBLICATIONS

"Draft text for Scheduling for mmWave Distribution Networks", IEEE 802,11-17/1640r0, (Nov. 2017), 8 pgs.

Cheng, Chen, "Protocol and frames for TDD link maintenance", doc.: IEEE 802. 11-18/0470r1, (Mar. 5, 2018), 16 pgs.

Grigat, Michael, "mmWave Distribution NetworkUsage Model", doc,:IEEE 802.11-17/1019r2, (Jul. 11, 2017), 15 pgs.

Maltsev, Alexander, "Cost-efficient technologies for development of the high-gain steerable antennas for mmWave communications", Wireless World Research Forum, (Oct. 2017), 24 pgs.

* cited by examiner

MANAGEMENT FRAMES FOR RATE ADAPTATION BY ENHANCED DIRECTIONAL MULTI-GIGABIT (EDMG) STATIONS IN MILLIMETER WAVE (MMWAVE) NETWORKS

PRIORITY CLAIM

This application claims the benefit of priority under 35 U.S.C. 119(e) to U.S. Provisional Patent Application Ser. No. 62/635,021, filed Feb. 26, 2018 [reference number AA9182-Z (4884.A13PRV)], which is incorporated herein by reference in its entirety.

TECHNICAL FIELD

Embodiments pertain to wireless networks. Some embodiments relate to wireless local area networks (WLANs) and Wi-Fi networks including networks operating in accordance with the IEEE 802.11 family of standards, such as the IEEE 802.11ay standard. Some embodiments relate to enhanced directional multi-gigabit (EDMG) communication.

BACKGROUND

In some cases, base stations and mobile devices may operate in millimeter wave (mmWave) frequencies, including but not limited to frequencies at 45 GHz and above. Various challenges may arise for such operation, including an increased demand for bandwidth by devices, an increase in the number of devices that demand service, an inability of the base station to meet the demands of the devices, and other challenges. Accordingly, techniques to improve performance, capacity, throughput, and coverage may become increasingly desirable in these and other scenarios, and therefore there is a general need for such techniques.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
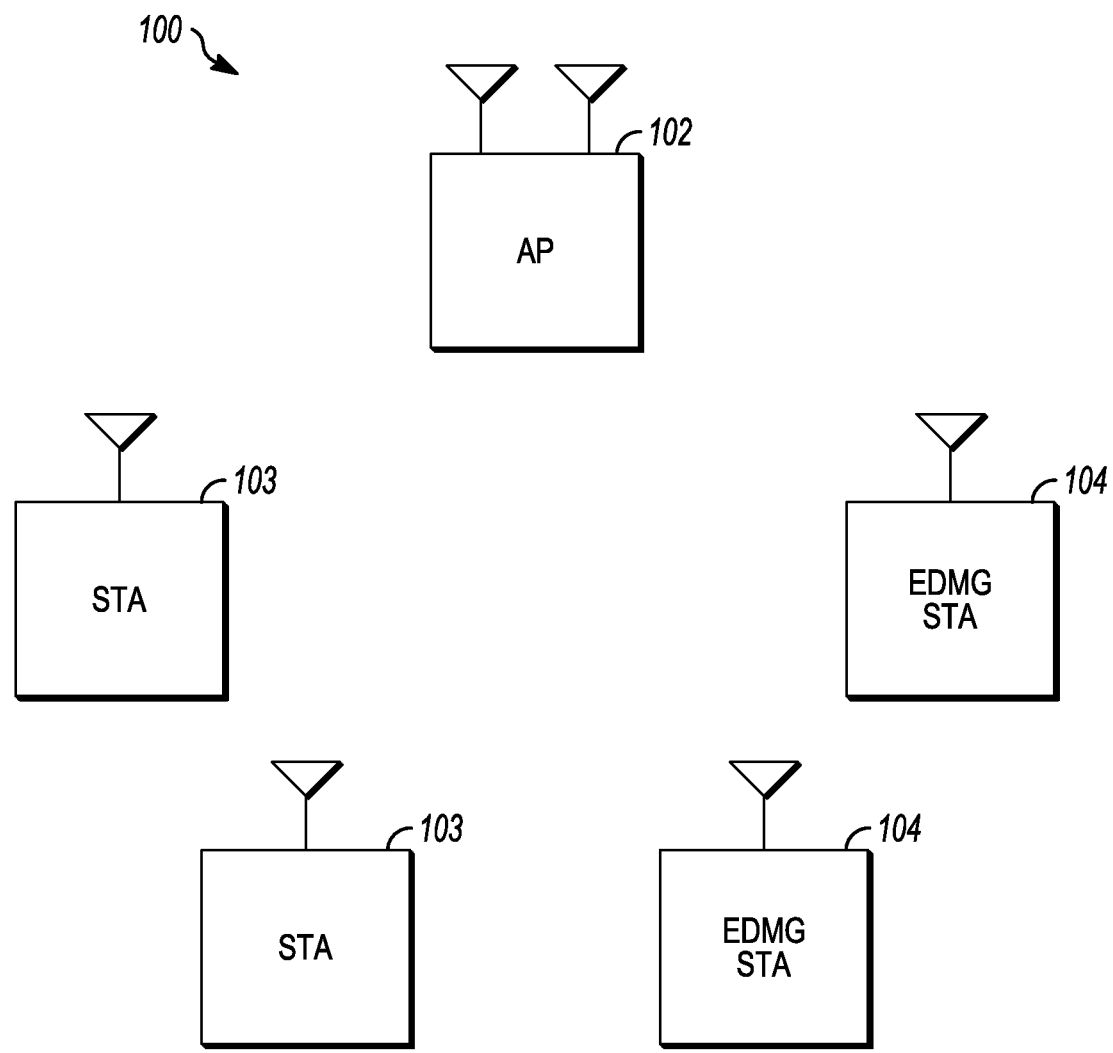
FIG. 1 illustrates a wireless network in accordance with some embodiments.

FIG. 1 illustrates a wireless network in accordance with some embodiments. In some embodiments, the network 100 may be a Wireless Local Area Network (WLAN) network. In some embodiments, the network 100 may be a Wi-Fi network. In some embodiments, the network 100 may be an enhanced directional multi-gigabit (EDMG) network. In some embodiments, the network 100 may support EDMG communication. These embodiments are not limiting, however, as some embodiments of the network 100 may include a combination of such networks. The network 100 may support EDMG devices in some embodiments, non EDMG devices in some embodiments, and a combination of EDMG devices and non EDMG devices in some embodiments. Although some techniques described herein may refer to an EDMG device, some or all of those techniques may be applicable to a non EDMG device, in some embodiments. In addition, although some techniques described herein may refer to a non EDMG device, some or all of those techniques may be applicable to an EDMG device, in some embodiments.

Referring to FIG. 1, the network 100 may include any or all of the components shown, and embodiments are not limited to the number of each component shown in FIG. 1. In some embodiments, the network 100 may include one or more APs 102. In some embodiments, the network 100 may include any number (including zero) of stations (STAs) 103. In some embodiments, the network 100 may include any number (including zero) of EDMG STAs 104. In some embodiments, the network 100 may include any number (including zero) of additional components not shown in FIG. 1.

In some embodiments, the AP 102 may transmit one or more packets, which may be received by an STA 103 and/or EDMG STA 104. In some embodiments, the STA 103 and/or EDMG STA 104 may transmit one or more packets, which may be received by the AP 102. These embodiments will be described in more detail below.

In some embodiments, the AP 102 may be arranged to communicate with one or more of the components shown in FIG. 1 in accordance with one or more IEEE 802.11 standards (including 802.11ay and/or others), other standards and/or other communication protocols. It should be noted that embodiments are not limited to usage of an AP 102. References herein to the AP 102 are not limiting and references herein to the master station 102 are also not limiting. In some embodiments, a STA 103, EDMG STA 104 and/or other device may be configurable to operate as a master station. Accordingly, in such embodiments, operations that may be performed by the AP 102 as described herein may be performed by the STA 103, EDMG STA 104 and/or other device that is configurable to operate as the master station.

In some embodiments, the STA 103 may be arranged to communicate with one or more of the components shown in FIG. 1 (such as APs 102, other STAs 103 and/or EDMG STAs 104) in accordance with one or more IEEE 802.11 standards (including 802.11ay and/or others), other standards and/or other communication protocols. In some embodiments, the EDMG STA 104 may be arranged to communicate with one or more of the components shown in FIG. 1 (such as APs 102, STAs 103 and/or other EDMG STAs 104) in accordance with one or more IEEE 802.11 standards (including 802.11ay and/or others), other standards and/or other communication protocols.

It should be noted that references herein to performance of a technique, operation and/or method by an STA 103 are not limiting. In some embodiments, an EDMG STA 104 may perform the same (or similar) technique, operation and/or method. In addition, references herein to performance of a technique, operation and/or method by an EDMG STA 104 are not limiting. In some embodiments, an STA 103 may perform the same (or similar) technique, operation and/or method.

References herein to a technique, operation and/or method that involves an STA 103 are not limiting, and may be applicable to an EDMG STA 104, in some embodiments. References herein to a technique, operation and/or method that involves an STA 103 are not limiting, and may be applicable to an EDMG STA 104, in some embodiments. In a non-limiting example, an operation described herein may include communication, by the AP 102, with an EDMG STA 104. In some embodiments, an operation may include similar communication, by the AP 102, with an STA 103. In another non-limiting example, an operation described herein may include communication, by the AP 102, with an STA 103. In some embodiments, an operation may include similar communication, by the AP 102, with an EDMG STA 104.

In some embodiments, one or more of the STAs 103 may be legacy stations, although the scope of embodiments is not limited in this respect. In some embodiments, one or more of the STAs 103 may be configured to operate as an EDMG STA 104. In some embodiments, one or more of the STAs 103 may support EDMG communication. In some embodiments, one or more of the STAs 103 may be configured to support communication in accordance with a WLAN protocol, an IEEE 802.11 protocol (including but not limited to 802.11ay), and/or other protocol.

In some embodiments, the AP 102, STA 103 and/or EDMG STA 104 may communicate in accordance with one or more of the following techniques and/or other techniques: orthogonal frequency division multiplexing (OFDM), orthogonal frequency division multiple access (OFDMA), time-division multiple access (TDMA), frequency division multiple access (FDMA), space-division multiple access (SDMA), and multi-user (MU) multiple-input multiple-output (MIMO) (MU-MIMO) communication. Such techniques may be used for uplink or downlink data communications.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Figure 2:
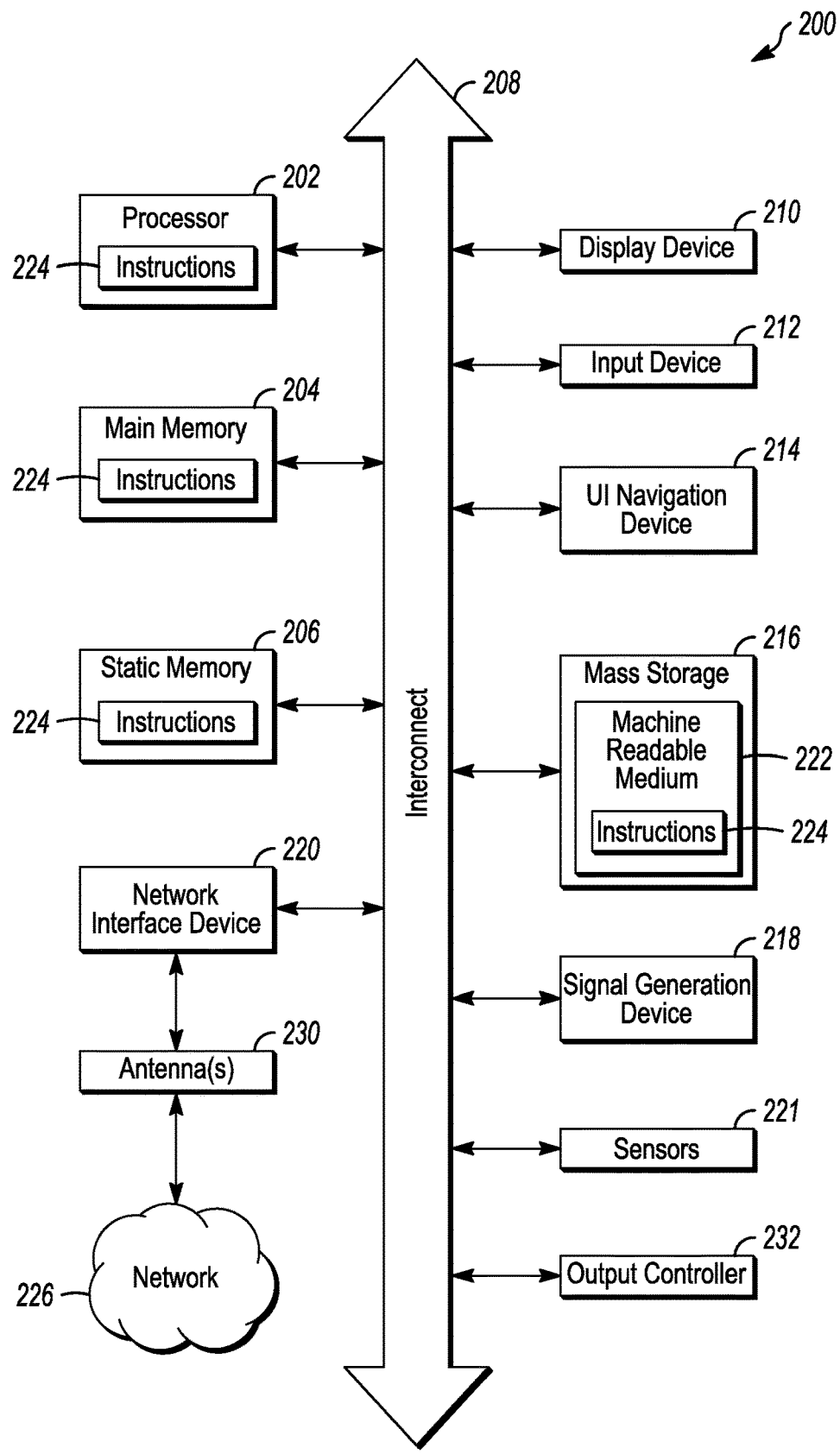
FIG. 2 illustrates an example machine in accordance with some embodiments.

FIG. 2 illustrates a block diagram of an example machine in accordance with some embodiments. The machine 200 is an example machine upon which any one or more of the techniques and/or methodologies discussed herein may be performed. In alternative embodiments, the machine 200 may operate as a standalone device or may be connected (e.g., networked) to other machines. In a networked deployment, the machine 200 may operate in the capacity of a server machine, a client machine, or both in server-client network environments. In an example, the machine 200 may act as a peer machine in peer-to-peer (P2P) (or other distributed) network environment. The machine 200 may be an AP 102, STA 103, EDMG STA 104, EMG device, UE, eNB, mobile device, base station, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer system) 200 may include a hardware processor 202 (e.g., a central processing unit (CPU), a graphics processing unit (GPU), a hardware processor core, or any combination thereof), a main memory 204 and a static memory 206, some or all of which may communicate with each other via an interlink (e.g., bus) 208. The machine 200 may further include a display unit 210, an alphanumeric input device 212 (e.g., a keyboard), and a user interface (UI) navigation device 214 (e.g., a mouse). In an example, the display unit 210, input device 212 and UI navigation device 214 may be a touch screen display. The machine 200 may additionally include a storage device (e.g., drive unit) 216, a signal generation device 218 (e.g., a speaker), a network interface device 220, and one or more sensors 221, such as a global positioning system (GPS)

sensor, compass, accelerometer, or other sensor. The machine 200 may include an output controller 228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a machine readable medium 222 on which is stored one or more sets of data structures or instructions 224 (e.g., software) embodying or utilized by any one or more of the techniques or functions described herein. The instructions 224 may also reside, completely or at least partially, within the main memory 204, within static memory 206, or within the hardware processor 202 during execution thereof by the machine 200. In an example, one or any combination of the hardware processor 202, the main memory 204, the static memory 206, or the storage device 216 may constitute machine readable media. In some embodiments, the machine readable medium may be or may include a non-transitory computer-readable storage medium. In some embodiments, the machine readable medium may be or may include a computer-readable storage medium.

While the machine readable medium 222 is illustrated as a single medium, the term "machine readable medium" may include a single medium or multiple media (e.g., a centralized or distributed database, and/or associated caches and servers) configured to store the one or more instructions 224. The term "machine readable medium" may include any medium that is capable of storing, encoding, or carrying instructions for execution by the machine 200 and that cause the machine 200 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 224 may further be transmitted or received over a communications network 226 using a transmission medium via the network interface device 220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 220 may include one or more physical jacks (e.g., Ethernet, coaxial, or phone jacks) or one or more antennas to connect to the communications network 226. In an example, the network interface device 220 may include a plurality of antennas to wirelessly communicate using at least one of single-input multiple-output (SIMO), multiple-input multiple-output (MIMO), or multiple-input single-output (MISO) techniques. In some examples, the network interface device 220 may wirelessly communicate using Multiple User MIMO techniques. The term "transmission medium" shall be taken to include any intangible medium that is capable of storing, encoding or carrying instructions for execution by the machine 200, and includes digital or analog communications signals or other intangible medium to facilitate communication of such software.

Figure 3:
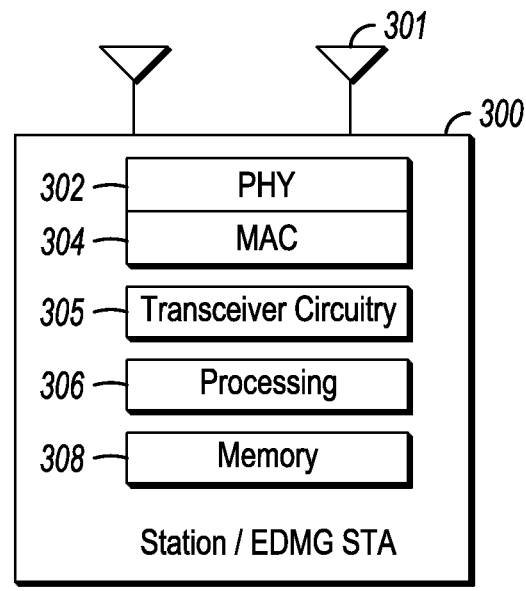
FIG. 3 illustrates a station (STA) in accordance with some embodiments and an access point (AP) in accordance with some embodiments.
Figure 3:
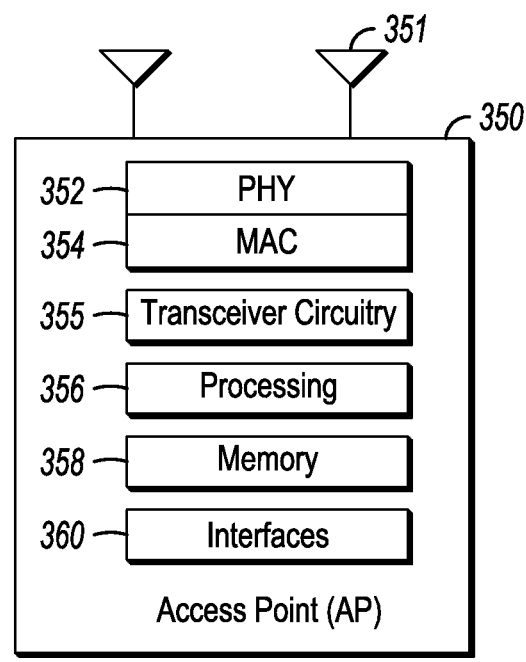

FIG. 3 illustrates a station (STA) and/or EDMG STA in accordance with some embodiments, and further illustrates an access point (AP) in accordance with some embodiments. It should be noted that in some embodiments, an STA, EDMG STA and/or other mobile device may include components shown in any or all of FIG. 2, FIG. 3 (as in 300), and FIGS. 4-7. The STA 300 may be suitable for use as an STA 103 as depicted in FIG. 1, in some embodiments. The EDMG STA 300 may be suitable for use as an EDMG STA 104 as depicted in FIG. 1, in some embodiments. It should also be noted that in some embodiments, an AP or other base station may include components shown in any or all of FIG. 2, FIG. 3 (as in 350), and FIGS. 4-7. The AP 350 may be suitable for use as an AP 102 as depicted in FIG. 1, in some embodiments.

The STA 300 and/or EDMG STA 300 may include physical layer circuitry 302 and a transceiver 305, one or both of which may enable transmission and reception of signals to and from components such as the AP 102 (FIG. 1), STAs, EDMG STAs or other devices using one or more antennas 301. As an example, the physical layer circuitry 302 may perform various encoding and decoding functions that may include formation of baseband signals for transmission and decoding of received signals. As another example, the transceiver 305 may perform various transmission and reception functions such as conversion of signals between a baseband range and a Radio Frequency (RF) range. Accordingly, the physical layer circuitry 302 and the transceiver 305 may be separate components or may be part of a combined component. In addition, some of the described functionality related to transmission and reception of signals may be performed by a combination that may include one, any or all of the physical layer circuitry 302, the transceiver 305, and other components or layers. The STA 300 and/or EDMG STA 300 may also include medium access control layer (MAC) circuitry 304 for controlling access to the wireless medium. The STA 300 and/or EDMG STA 300 may also include processing circuitry 306 and memory 308 arranged to perform the operations described herein.

The AP 350 may include physical layer circuitry 352 and a transceiver 355, one or both of which may enable transmission and reception of signals to and from components such as the STA 103 (FIG. 1), other APs or other devices using one or more antennas 351. As an example, the physical layer circuitry 352 may perform various encoding and decoding functions that may include formation of baseband signals for transmission and decoding of received signals. As another example, the transceiver 355 may perform various transmission and reception functions such as conversion of signals between a baseband range and a Radio Frequency (RF) range. Accordingly, the physical layer circuitry 352 and the transceiver 355 may be separate components or may be part of a combined component. In addition, some of the described functionality related to transmission and reception of signals may be performed by a combination that may include one, any or all of the physical layer circuitry 352, the transceiver 355, and other components or layers. The AP 350 may also include medium access control layer (MAC) circuitry 354 for controlling access to the wireless medium. The AP 350 may also include processing circuitry 356 and memory 358 arranged to perform the operations described herein.

The antennas 301, 351, 230 may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas 301, 351, 230 may be effectively separated to take advantage of spatial diversity and the different channel characteristics that may result.

In some embodiments, the STA 300 may be configured as an EDMG device 104 (FIG. 1), and may communicate using OFDM and/or OFDMA communication signals. In some embodiments, the AP 350 may be configured to communicate using OFDM and/or OFDMA communication signals. In some embodiments, the EDMG device 104 may be configured to communicate using OFDM communication signals over a multicarrier communication channel. Accordingly, in some cases, the STA 300, EDMG STA 300, AP 350 and/or other device may be configured to receive signals in accordance with specific communication standards, such as the Institute of Electrical and Electronics Engineers (IEEE) standards including IEEE 802.11ay, 802.11-2012, 802.11n-2009 and/or 802.11ac-2013 standards and/or proposed specifications for WLANs including proposed 802.11ay standards. The scope of the embodiments is not limited in this respect, however, as the STA 300, EDMG STA 300, AP 350 and/or other device may also be suitable to transmit and/or receive communications in accordance with other techniques and standards. In some other embodiments, the AP 350, EDMG device 104 and/or the STA 300 may be configured to receive signals that were transmitted using one or more modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, the STA 300, EDMG STA 300 and/or AP 350 may be a mobile device and may be a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a wearable device such as a medical device (e.g., a heart rate monitor, a blood pressure monitor, etc.), or other device that may receive and/or transmit information wirelessly. In some embodiments, the STA 300, EDMG STA 300 and/or AP 350 may be configured to operate in accordance with 802.11 standards, although the scope of the embodiments is not limited in this respect. Mobile devices or other devices in some embodiments may be configured to operate according to other protocols or standards, including other IEEE standards, Third Generation Partnership Project (3GPP) standards or other standards. In some embodiments, the STA 300 and/or AP 350 may include one or more of a keyboard, a display, a non-volatile memory port, multiple antennas, a graphics processor, an application processor, speakers, and other mobile device elements. The display may be an LCD screen including a touch screen.

Although the STA 300, EDMG STA 300 and the AP 350 are each illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

It should be noted that in some embodiments, an apparatus used by the STA 300 may include various components of the STA 300 as shown in FIG. 3 and/or the example machine 200 as shown in FIG. 2. Accordingly, techniques and operations described herein that refer to the STA 300 (or 103) may be applicable to an apparatus for an STA, in some embodiments. It should be noted that in some embodiments, an apparatus used by the EDMG STA 300 may include various components of the EDMG STA 300 as shown in FIG. 3 and/or the example machine 200 as shown in FIG. 2. Accordingly, techniques and operations described herein that refer to the EDMG STA 300 (or 104) may be applicable to an apparatus for an EDMG STA, in some embodiments. It should also be noted that in some embodiments, an apparatus used by the AP 350 may include various components of the AP 350 as shown in FIG. 3 and/or the example machine 200 as shown in FIG. 2. Accordingly, techniques and operations described herein that refer to the AP 350 (or 102) may be applicable to an apparatus for an AP, in some embodiments. In addition, an apparatus for a mobile device and/or base station may include one or more components shown in FIGS. 2-3, in some embodiments. Accordingly, techniques and operations described herein that refer to a mobile device and/or base station may be applicable to an apparatus for a mobile device and/or base station, in some embodiments.

Figure 4:
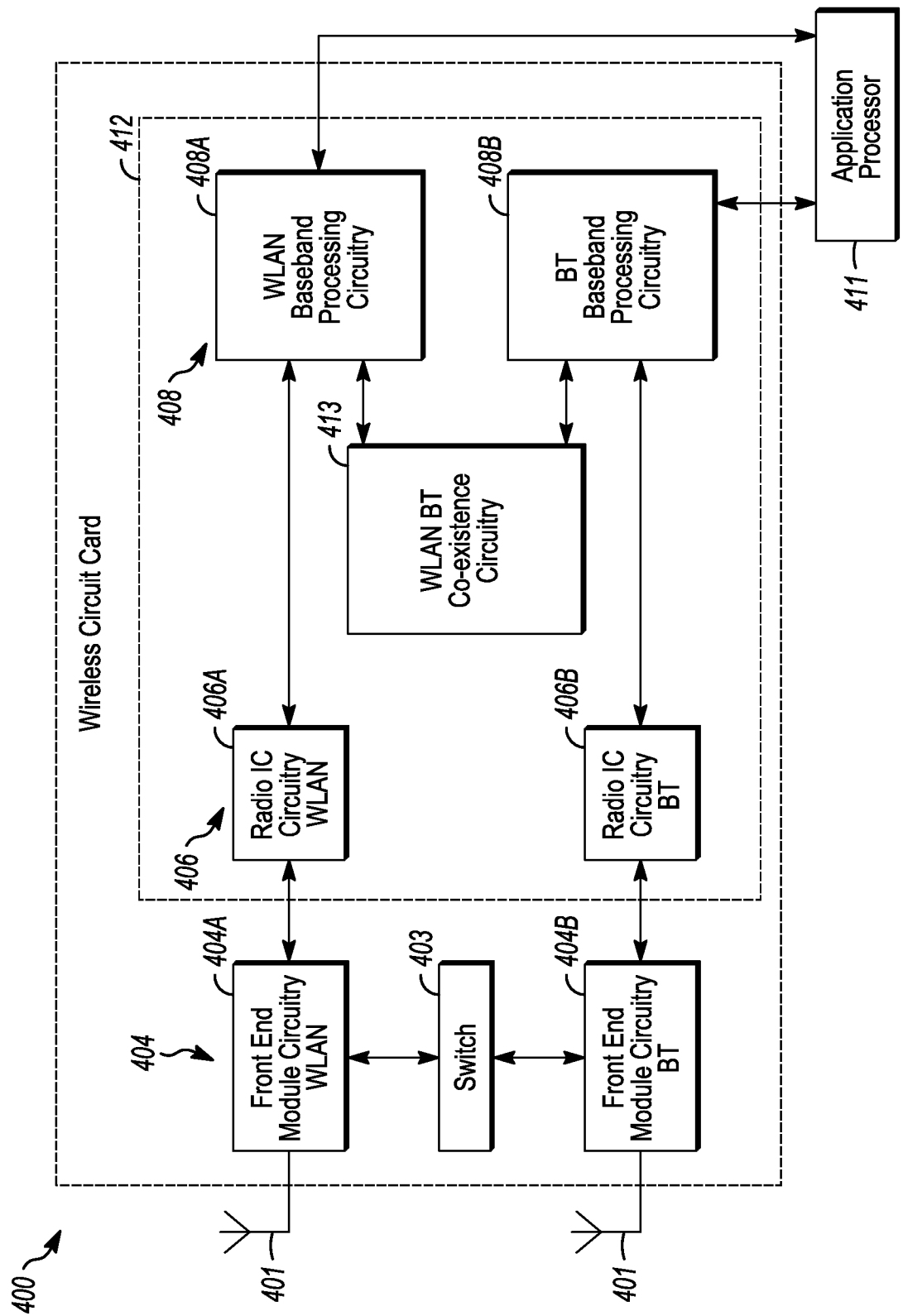
FIG. 4 is a block diagram of a radio architecture in accordance with some embodiments.

FIG. 4 is a block diagram of a radio architecture 400 in accordance with some embodiments. Radio architecture 400 may include radio front-end module (FEM) circuitry 404, radio IC circuitry 406 and baseband processing circuitry 408. Radio architecture 400 as shown includes both Wireless Local Area Network (WLAN) functionality and Bluetooth (BT) functionality although embodiments are not so limited. In this disclosure, "WLAN" and "Wi-Fi" are used interchangeably.

Although a dual-mode architecture is shown in FIGS. 4-7, it is understood that embodiments are not limited to dual-mode architectures. In some embodiments, a single-mode architecture may include one or more of the components shown in FIGS. 4-7. In some embodiments, one or more of the functionalities described below for the dual-mode architecture of FIGS. 4-7 may be performed in a single-mode architecture. In a non-limiting example: the single-mode architecture may include components arranged in a manner similar to one of the paths of the dual-mode architecture; and some or all of the functionality of one of the paths of the dual-mode architecture (and/or similar functionality) may be performed in the single-mode architecture.

Figure 5:
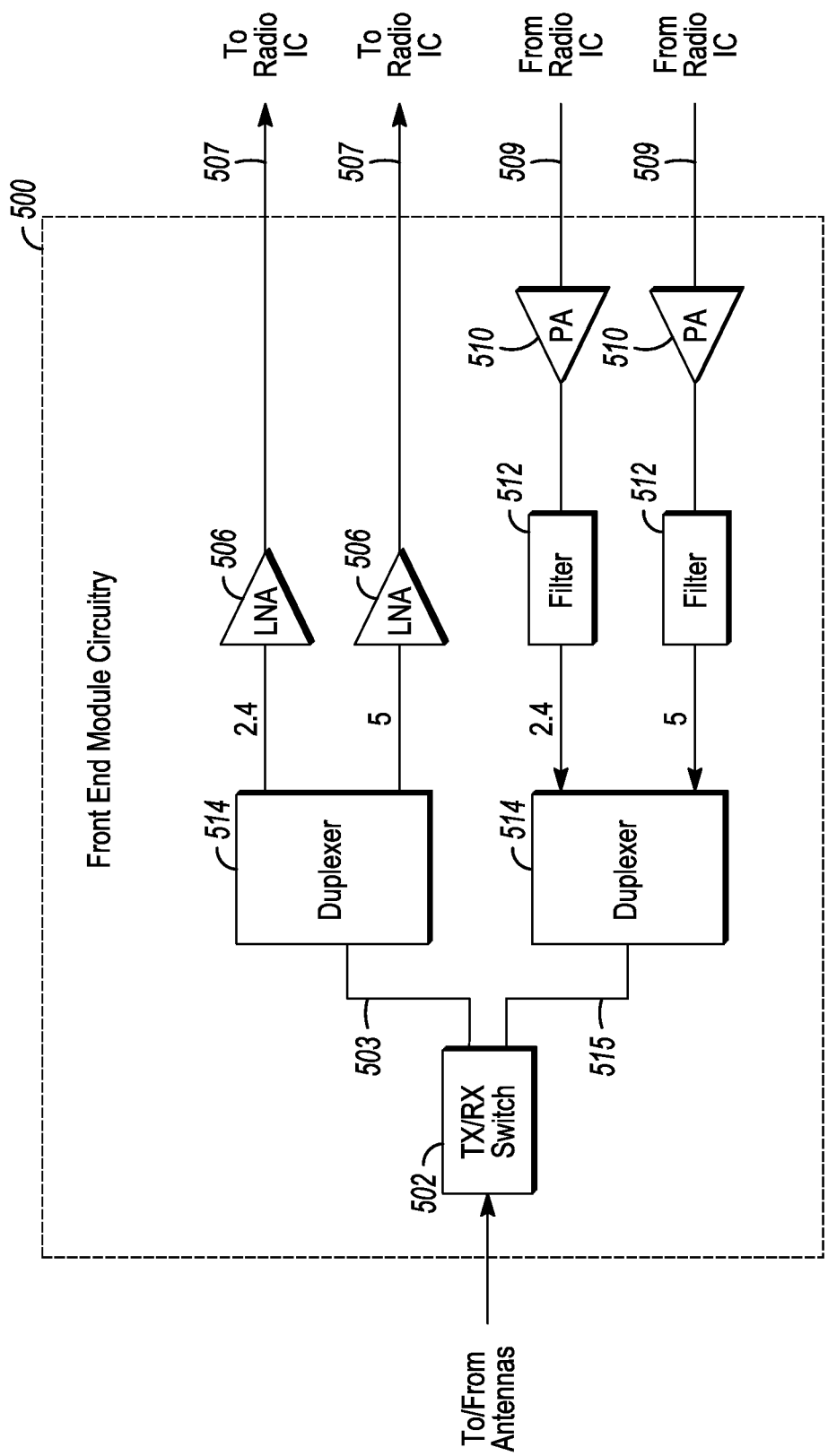
FIG. 5 illustrates a front-end module circuitry for use in the radio architecture of FIG. 4 in accordance with some embodiments.
Figure 6:
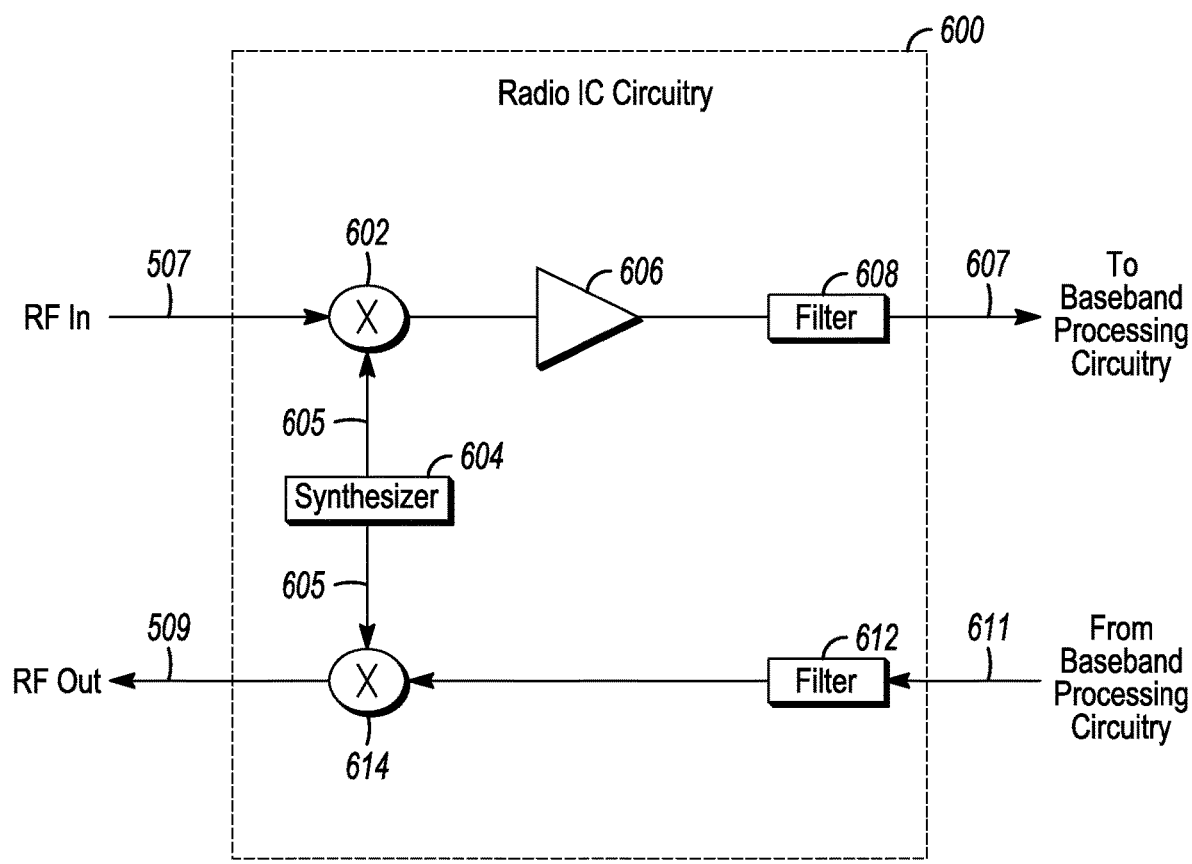
FIG. 6 illustrates a radio IC circuitry for use in the radio architecture of FIG. 4 in accordance with some embodiments.
Figure 7:
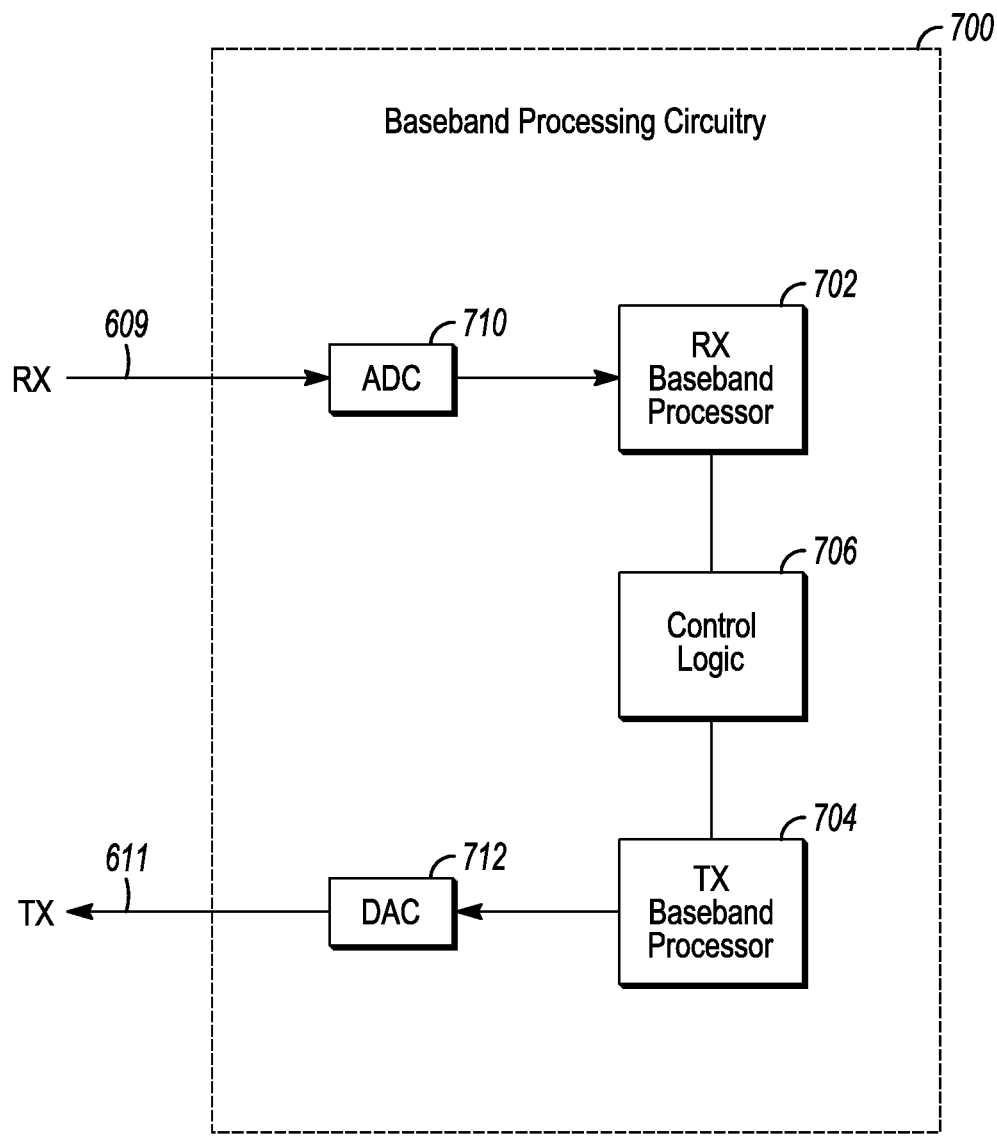
FIG. 7 illustrates a baseband processing circuitry for use in the radio architecture of FIG. 4 in accordance with some embodiments.

It should be noted that the radio architecture 400 and components shown in FIGS. 5-7 support WLAN and BT, but embodiments are not limited to WLAN or BT. In some embodiments, two technologies supported by the radio architecture 400 may or may not include WLAN or BT. Other technologies may be supported. In some embodiments, WLAN and a second technology may be supported. In some embodiments, BT and a second technology may be supported. In some embodiments, two technologies other than WLAN and BT may be supported. In addition, the radio architecture 400 may be extended to support more than two protocols, technologies and/or standards, in some embodiments. Embodiments are also not limited to the frequencies illustrated in FIGS. 4-7.

FEM circuitry 404 may include a WLAN or Wi-Fi FEM circuitry 404A and a Bluetooth (BT) FEM circuitry 404B. The WLAN FEM circuitry 404A may include a receive signal path comprising circuitry configured to operate on WLAN RF signals received from one or more antennas 401, to amplify the received signals and to provide the amplified versions of the received signals to the WLAN radio IC circuitry 406A for further processing. The BT FEM circuitry 404B may include a receive signal path which may include circuitry configured to operate on BT RF signals received from one or more antennas 401, to amplify the received signals and to provide the amplified versions of the received signals to the BT radio IC circuitry 406B for further processing. FEM circuitry 404A may also include a transmit signal path which may include circuitry configured to amplify WLAN signals provided by the radio IC circuitry 406A for wireless transmission by one or more of the antennas 401. In addition, FEM circuitry 404B may also include a transmit signal path which may include circuitry configured to amplify BT signals provided by the radio IC circuitry 406b for wireless transmission by the one or more antennas. In the embodiment of FIG. 4, although FEM 404A and FEM 404B are shown as being distinct from one another, embodiments are not so limited, and include within their scope the use of an FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 406 as shown may include WLAN radio IC circuitry 406A and BT radio IC circuitry 406B. The WLAN radio IC circuitry 406A may include a receive signal path which may include circuitry to down-convert WLAN RF signals received from the FEM circuitry 404A and provide baseband signals to WLAN baseband processing circuitry 408a. BT radio IC circuitry 406B may in turn include a receive signal path which may include circuitry to down-convert BT RF signals received from the FEM circuitry 404B and provide baseband signals to BT baseband processing circuitry 408B. WLAN radio IC circuitry 406A may also include a transmit signal path which may include circuitry to up-convert WLAN baseband signals provided by the WLAN baseband processing circuitry 408A and provide WLAN RF output signals to the FEM circuitry 404A for subsequent wireless transmission by the one or more antennas 401. BT radio IC circuitry 406B may also include a transmit signal path which may include circuitry to up-convert BT baseband signals provided by the BT baseband processing circuitry 408B and provide BT RF output signals to the FEM circuitry 404B for subsequent wireless transmission by the one or more antennas 401. In the embodiment of FIG. 4, although radio IC circuitries 406A and 406B are shown as being distinct from one another, embodiments are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 408 may include a WLAN baseband processing circuitry 408A and a BT baseband processing circuitry 408B. The WLAN baseband processing circuitry 408A may include a memory, such as, for example, a set of RAM arrays in a Fast Fourier Transform or Inverse Fast Fourier Transform block (not shown) of the WLAN baseband processing circuitry 408A. Each of the WLAN baseband circuitry 408A and the BT baseband circuitry 408B may further include one or more processors and control logic to process the signals received from the corresponding WLAN or BT receive signal path of the radio IC circuitry 406, and to also generate corresponding WLAN or BT baseband signals for the transmit signal path of the radio IC circuitry 406. Each of the baseband processing circuitries 408A and 408B may further include physical layer (PHY) and medium access control layer (MAC) circuitry, and may further interface with application processor 411 for generation and processing of the baseband signals and for controlling operations of the radio IC circuitry 406.

Referring still to FIG. 4, according to the shown embodiment, WLAN-BT coexistence circuitry 413 may include logic providing an interface between the WLAN baseband circuitry 408A and the BT baseband circuitry 408B to enable use cases requiring WLAN and BT coexistence. In addition, a switch 403 may be provided between the WLAN FEM circuitry 404A and the BT FEM circuitry 404B to allow switching between the WLAN and BT radios according to application needs. In addition, although the antennas 401 are depicted as being respectively connected to the WLAN FEM circuitry 404A and the BT FEM circuitry 404B, embodiments include within their scope the sharing of one or more antennas as between the WLAN and BT FEMs, or the provision of more than one antenna connected to each of FEM 404A or 404B.

In some embodiments, the front-end module circuitry 404, the radio IC circuitry 406, and baseband processing circuitry 408 may be provided on a single radio card, such as wireless radio card 402. In some other embodiments, the one or more antennas 401, the FEM circuitry 404 and the radio IC circuitry 406 may be provided on a single radio card. In some other embodiments, the radio IC circuitry 406 and the baseband processing circuitry 408 may be provided on a single chip or integrated circuit (IC), such as IC 412.

In some embodiments, the wireless radio card 402 may include a WLAN radio card and may be configured for Wi-Fi communications, although the scope of the embodiments is not limited in this respect. In some of these embodiments, the radio architecture 400 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some of these multicarrier embodiments, radio architecture 400 may be part of a Wi-Fi communication station (STA) such as a wireless access point (AP), a base station or a mobile device including a Wi-Fi device. In some of these embodiments, radio architecture 400 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, and/or 802.11ax standards and/or proposed specifications for WLANs, although the scope of embodiments is not limited in this respect. Radio architecture 400 may also be suitable to transmit and/or receive communications in accordance with other techniques and standards.

In some embodiments, the radio architecture 400 may be configured for high-efficiency (HE) Wi-Fi (HEW) communications in accordance with the IEEE 802.11ax standard. In these embodiments, the radio architecture 400 may be configured to communicate in accordance with an OFDMA technique, although the scope of the embodiments is not limited in this respect.

In some other embodiments, the radio architecture 400 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 4, the BT baseband circuitry 408B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 4, the radio architecture 400 may be configured to establish a BT synchronous connection oriented (SCO) link and/or a BT low energy (BT LE) link. In some of the embodiments that include functionality, the radio architecture 400 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 4, the functions of a BT radio card and WLAN radio card may be combined on a single wireless radio card, such as single wireless radio card 402, although embodiments are not so limited, and include within their scope discrete WLAN and BT radio cards.

In some embodiments, the radio-architecture 400 may include other radio cards, such as a cellular radio card configured for cellular (e.g., 3GPP such as LTE, LTE-Advanced or 5G communications). In some IEEE 802.11 embodiments, the radio architecture 400 may be configured for communication over various channel bandwidths including bandwidths having center frequencies of about 900 MHz, 2.4 GHz, 5 GHz and/or other(s). In some embodiments, the bandwidths may be about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. In some embodiments, the bandwidths may be about 2.16 GHz, 4.32 GHz, 6.48 GHz, 8.72 GHz and/or other suitable value. The scope of the embodiments is not limited with respect to the above center frequencies or bandwidths, however.

FIG. 5 illustrates FEM circuitry 500 in accordance with some embodiments. The FEM circuitry 500 is one example of circuitry that may be suitable for use as the WLAN and/or BT FEM circuitry 404A/404B (FIG. 4), although other circuitry configurations may also be suitable.

In some embodiments, the FEM circuitry 500 may include a TX/RX switch 502 to switch between transmit mode and receive mode operation. The FEM circuitry 500 may include a receive signal path and a transmit signal path. The receive signal path of the FEM circuitry 500 may include a low-noise amplifier (LNA) 506 to amplify received RF signals 503 and provide the amplified received RF signals 507 as an output (e.g., to the radio IC circuitry 406 (FIG. 4)). The transmit signal path of the circuitry 500 may include a power amplifier (PA) 510 to amplify input RF signals 509 (e.g., provided by the radio IC circuitry 406), and one or more filters 512, such as band-pass filters (BPFs), low-pass filters (LPFs) or other types of filters, to generate RF signals 515 for subsequent transmission (e.g., by one or more of the antennas 401 (FIG. 4)).

In some dual-mode embodiments for Wi-Fi communication, the FEM circuitry 500 may be configured to operate in either the 2.4 GHz frequency spectrum or the 5 GHz frequency spectrum. In these embodiments, the receive signal path of the FEM circuitry 500 may include a receive signal path duplexer 504 to separate the signals from each spectrum as well as provide a separate LNA 506 for each spectrum as shown. In these embodiments, the transmit signal path of the FEM circuitry 500 may also include a power amplifier 510 and a filter 512, such as a BPF, a LPF or another type of filter for each frequency spectrum and a transmit signal path duplexer 514 to provide the signals of one of the different spectrums onto a single transmit path for subsequent transmission by the one or more of the antennas 401 (FIG. 4). In some embodiments, BT communications may utilize the 2.4 GHZ signal paths and may utilize the same FEM circuitry 500 as the one used for WLAN communications.

FIG. 6 illustrates radio IC circuitry 600 in accordance with some embodiments. The radio IC circuitry 600 is one example of circuitry that may be suitable for use as the WLAN or BT radio IC circuitry 406A/406B (FIG. 4), although other circuitry configurations may also be suitable.

In some embodiments, the radio IC circuitry 600 may include a receive signal path and a transmit signal path. The receive signal path of the radio IC circuitry 600 may include at least mixer circuitry 602, such as, for example, down-conversion mixer circuitry, amplifier circuitry 606 and filter circuitry 608. The transmit signal path of the radio IC circuitry 600 may include at least filter circuitry 612 and mixer circuitry 614, such as, for example, up-conversion mixer circuitry. Radio IC circuitry 600 may also include synthesizer circuitry 604 for synthesizing a frequency 605 for use by the mixer circuitry 602 and the mixer circuitry 614. The mixer circuitry 602 and/or 614 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 6 illustrates only a simplified version of a radio IC circuitry, and may include, although not shown, embodiments where each of the depicted circuitries may include more than one component. For instance, mixer circuitry 602 and/or 614 may each include one or more mixers, and filter circuitries 608 and/or 612 may each include one or more filters, such as one or more BPFs and/or LPFs according to application needs. For example, when mixer circuitries are of the direct-conversion type, they may each include two or more mixers.

In some embodiments, mixer circuitry 602 may be configured to down-convert RF signals 507 received from the FEM circuitry 404 (FIG. 4) based on the synthesized frequency 605 provided by synthesizer circuitry 604. The amplifier circuitry 606 may be configured to amplify the down-converted signals and the filter circuitry 608 may include a LPF configured to remove unwanted signals from the down-converted signals to generate output baseband signals 607. Output baseband signals 607 may be provided to the baseband processing circuitry 408 (FIG. 4) for further processing. In some embodiments, the output baseband signals 607 may be zero-frequency baseband signals, although this is not a requirement. In some embodiments, mixer circuitry 602 may comprise passive mixers, although the scope of the embodiments is not limited in this respect.

In some embodiments, the mixer circuitry 614 may be configured to up-convert input baseband signals 611 based on the synthesized frequency 605 provided by the synthesizer circuitry 604 to generate RF output signals 509 for the FEM circuitry 404. The baseband signals 611 may be provided by the baseband processing circuitry 408 and may be filtered by filter circuitry 612. The filter circuitry 612 may include a LPF or a BPF, although the scope of the embodiments is not limited in this respect.

In some embodiments, the mixer circuitry 602 and the mixer circuitry 614 may each include two or more mixers and may be arranged for quadrature down-conversion and/or up-conversion respectively with the help of synthesizer 604. In some embodiments, the mixer circuitry 602 and the mixer circuitry 614 may each include two or more mixers each configured for image rejection (e.g., Hartley image rejection). In some embodiments, the mixer circuitry 602 and the mixer circuitry 614 may be arranged for direct down-conversion and/or direct up-conversion, respectively. In some embodiments, the mixer circuitry 602 and the mixer circuitry 614 may be configured for super-heterodyne operation, although this is not a requirement.

Mixer circuitry 602 may comprise, according to one embodiment: quadrature passive mixers (e.g., for the in-phase (I) and quadrature phase (Q) paths). In such an embodiment, RF input signal 507 from FIG. 6 may be down-converted to provide I and Q baseband output signals to be sent to the baseband processor.

Quadrature passive mixers may be driven by zero and ninety degree time-varying LO switching signals provided by a quadrature circuitry which may be configured to receive a LO frequency ($f_{LO}$) from a local oscillator or a synthesizer, such as LO frequency 605 of synthesizer 604 (FIG. 6). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety degree time-varying switching signals may be generated by the synthesizer, although the scope of the embodiments is not limited in this respect.

In some embodiments, the LO signals may differ in duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature phase (Q) path) may operate at a 25% duty cycle, which may result in a significant reduction is power consumption.

The RF input signal 507 (FIG. 5) may comprise a balanced signal, although the scope of the embodiments is not limited in this respect. The I and Q baseband output signals may be provided to low-nose amplifier, such as amplifier circuitry 606 (FIG. 6) or to filter circuitry 608 (FIG. 6).

In some embodiments, the output baseband signals 607 and the input baseband signals 611 may be analog baseband signals, although the scope of the embodiments is not limited in this respect. In some alternate embodiments, the output baseband signals 607 and the input baseband signals 611 may be digital baseband signals. In these alternate embodiments, the radio IC circuitry may include analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 604 may be a fractional-N synthesizer or a fractional N/N+1 synthesizer, although the scope of the embodiments is not limited in this respect as other types of frequency synthesizers may be suitable. For example, synthesizer circuitry 604 may be a delta-sigma synthesizer, a frequency multiplier, a frequency-locked loop or a synthesizer comprising a phase-locked loop with a frequency divider. According to some embodiments, the synthesizer circuitry 604 may include digital synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 604 may be provided by a voltage controlled oscillator (VCO), although that is not a requirement. A divider control input may further be provided by either the baseband processing circuitry 408 (FIG. 4) or the application processor 411 (FIG. 4) depending on the desired output frequency 605. In some embodiments, a divider control input (e.g., N) may be determined from a look-up table (e.g., within a Wi-Fi card) based on a channel number and a channel center frequency as determined or indicated by the application processor 411.

In some embodiments, synthesizer circuitry 604 may be configured to generate a carrier frequency as the output frequency 605, while in other embodiments, the output frequency 605 may be a fraction of the carrier frequency (e.g., one-half the carrier frequency, one-third the carrier frequency). In some embodiments, the output frequency 605 may be a LO frequency ($f_{LO}$).

FIG. 7 illustrates a functional block diagram of baseband processing circuitry 700 in accordance with some embodiments. The baseband processing circuitry 700 is one example of circuitry that may be suitable for use as the baseband processing circuitry 408 (FIG. 4), although other circuitry configurations may also be suitable. The baseband processing circuitry 700 may include a receive baseband processor (RX BBP) 702 for processing receive baseband signals 609 provided by the radio IC circuitry 406 (FIG. 4) and a transmit baseband processor (TX BBP) 704 for generating transmit baseband signals 611 for the radio IC circuitry 406. The baseband processing circuitry 700 may also include control logic 706 for coordinating the operations of the baseband processing circuitry 700.

In some embodiments (e.g., when analog baseband signals are exchanged between the baseband processing circuitry 700 and the radio IC circuitry 406), the baseband processing circuitry 700 may include ADC 710 to convert analog baseband signals received from the radio IC circuitry 406 to digital baseband signals for processing by the RX BBP 702. In these embodiments, the baseband processing circuitry 700 may also include DAC 712 to convert digital baseband signals from the TX BBP 704 to analog baseband signals.

In some embodiments that communicate OFDM signals or OFDMA signals, such as through baseband processor 408A, the transmit baseband processor 704 may be configured to generate OFDM or OFDMA signals as appropriate for transmission by performing an inverse fast Fourier transform (IFFT). The receive baseband processor 702 may be configured to process received OFDM signals or OFDMA signals by performing an FFT. In some embodiments, the receive baseband processor 702 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 4, in some embodiments, the antennas 401 (FIG. 4) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. Antennas 401 may each include a set of phased-array antennas, although embodiments are not so limited.

Although the radio-architecture 400 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

In accordance with some embodiments, the EDMG STA 104 may decode a Link Measurement Request Frame received from an AP 102. The Link Measurement Request Frame may include a request for information for time division duplexing (TDD) rate adaptation. The EDMG STA 104 may encode a Link Measurement Response Frame for transmission. The Link Measurement Response Frame may be encoded to include a Directional Multi Gigabit (DMG) Link Margin element to indicate the information for the TDD rate adaptation. The DMG Link Margin element may include a Rate Adaption Control parameter. The DMG Link Margin element may be configurable to include one or more optional fields for the TDD rate adaptation and transmit power control. The Rate Adaptation Control parameter may indicate: a number of space time streams (STSs) for which information is included in the DMG Link Margin element; and whether the DMG Link Margin element includes the one or more optional fields. These embodiments will be described in more detail below.

Figure 8:
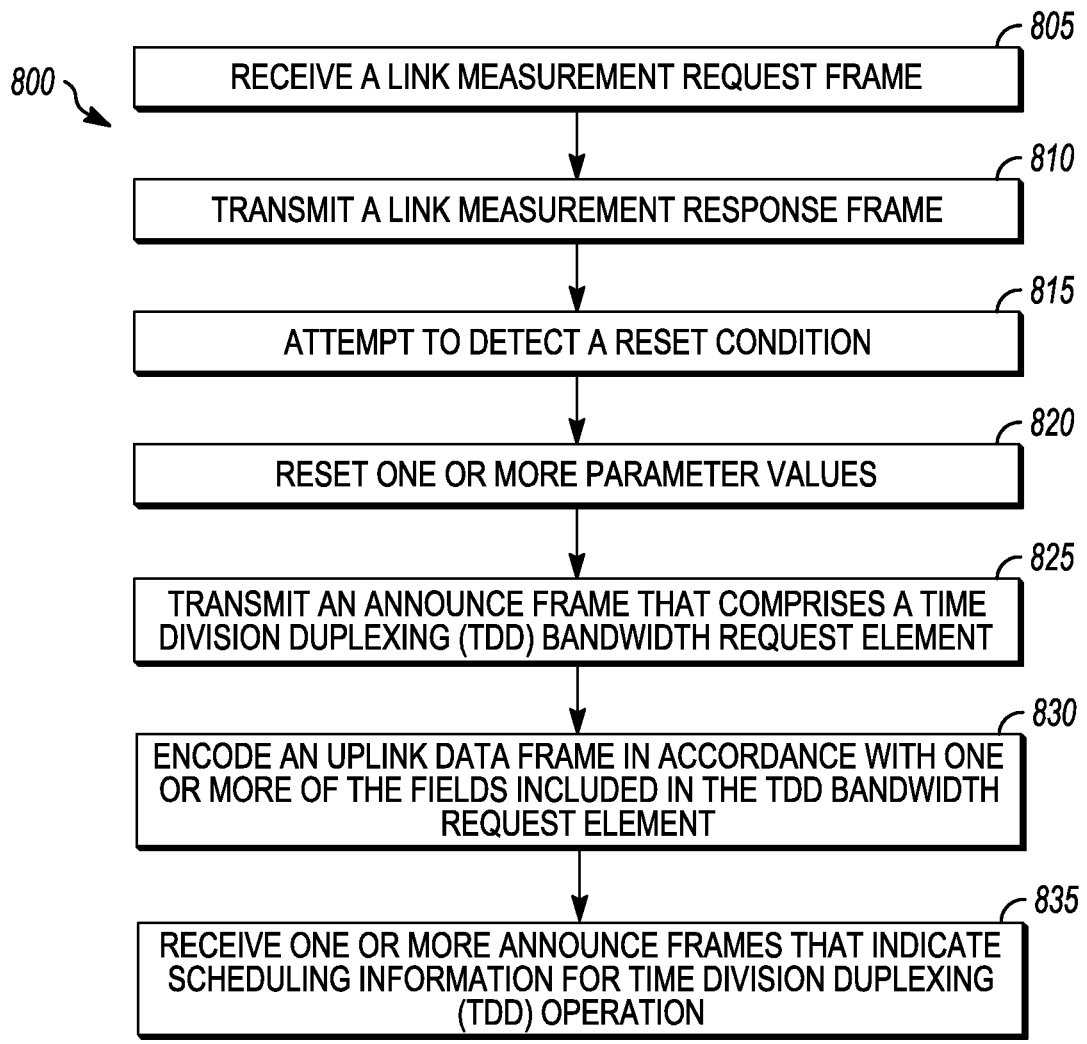
FIG. 8 illustrates the operation of a method of communication in accordance with some embodiments.
Figure 9:
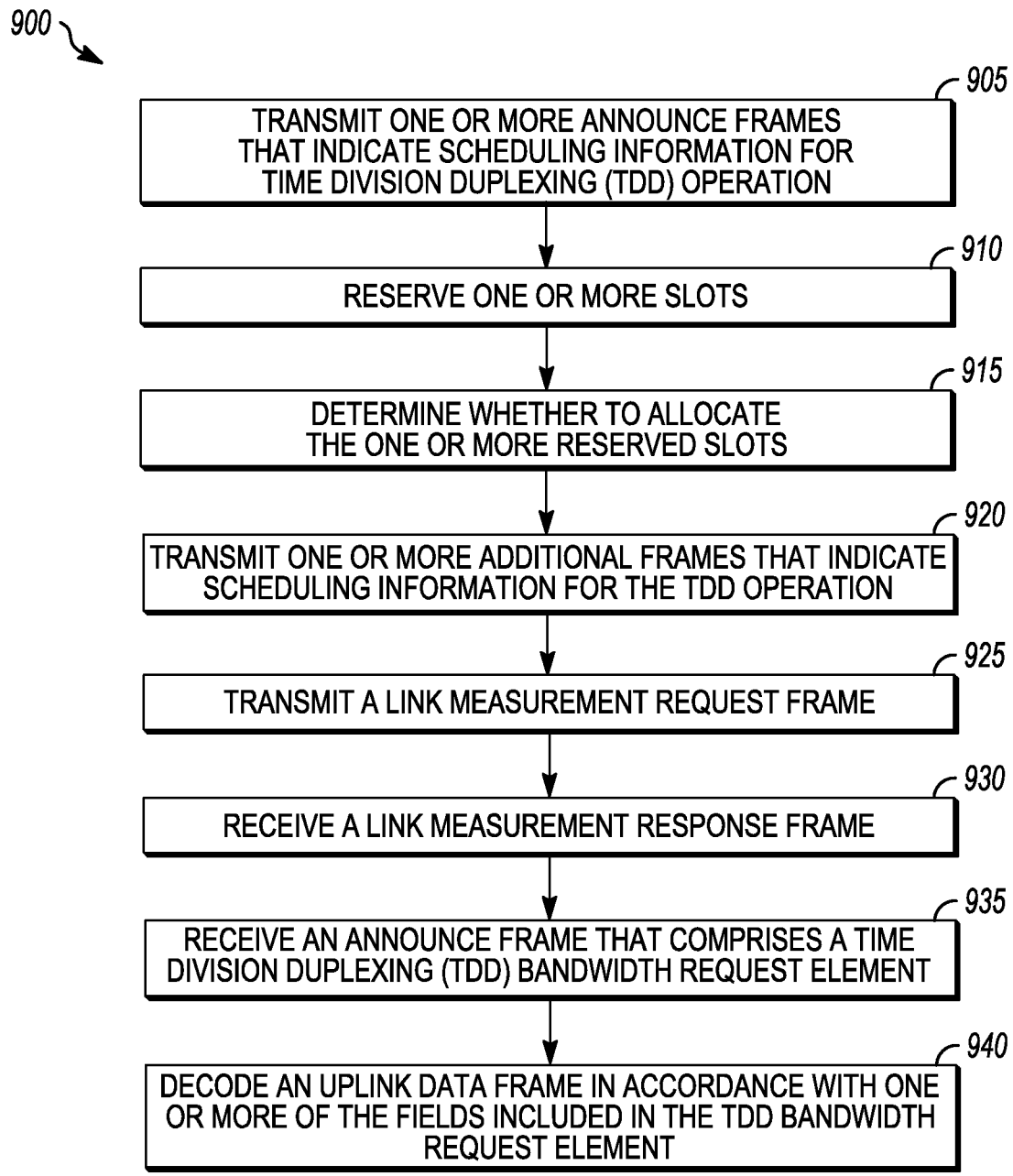
FIG. 9 illustrates the operation of another method of communication in accordance with some embodiments.

FIG. 8 illustrates the operation of a method of communication in accordance with some embodiments. FIG. 9 illustrates the operation of another method of communication in accordance with some embodiments. It is important to note that embodiments of the methods 800, 900 may include additional or even fewer operations or processes in comparison to what is illustrated in FIGS. 8-9. In addition, embodiments of the methods 800, 900 are not necessarily limited to the chronological order that is shown in FIGS. 8-9. In describing the methods 800, 900, reference may be made to one or more figures, although it is understood that the methods 800, 900 may be practiced with any other suitable systems, interfaces and components.

In some embodiments, an EDMG STA 104 may perform one or more operations of the method 800, but embodiments are not limited to performance of the method 800 and/or operations of it by the EDMG STA 104. In some embodiments, another device and/or component may perform one or more operations of the method 800. In some embodiments, another device and/or component may perform one or more operations that may be similar to one or more operations of the method 800. In some embodiments, another device and/or component may perform one or more operations that may be reciprocal to one or more operations of the method 800. In a non-limiting example, the STA 103 may perform an operation that may be the same as, similar to, reciprocal to and/or related to an operation of the method 800, in some embodiments. In another non-limiting example, an STA 103 configured to operate as an EDMG STA may perform an operation that may be the same as, similar to, reciprocal to and/or related to an operation of the method 800, in some embodiments. In another non-limiting example, the AP 102 may perform an operation that may be the same as, similar to, reciprocal to and/or related to an operation of the method 800, in some embodiments.

In some embodiments, an AP 102 may perform one or more operations of the method 900, but embodiments are not limited to performance of the method 900 and/or operations of it by the AP 102. In some embodiments, another device and/or component may perform one or more operations of the method 900. In some embodiments, another device and/or component may perform one or more operations that may be similar to one or more operations of the method 900. In some embodiments, another device and/or component may perform one or more operations that may be reciprocal to one or more operations of the method 900. In a non-limiting example, the EDMG STA 104 may perform an operation that may be the same as, similar to, reciprocal to and/or related to an operation of the method 900, in some embodiments. In another non-limiting example, the STA 103 may perform an operation that may be the same as, similar to, reciprocal to and/or related to an operation of the method 900, in some embodiments.

It should be noted that one or more operations of one of the methods 800, 900 may be the same as, similar to and/or reciprocal to one or more operations of the other method. For instance, an operation of the method 800 may be the same as, similar to and/or reciprocal to an operation of the method 900, in some embodiments. In a non-limiting example, an operation of the method 800 may include reception of an element (such as a frame, block, message and/or other) by the EDMG STA 104, and an operation of the method 900 may include transmission of a same element (and/or similar element) by the AP 102. In some cases, descriptions of operations and techniques described as part of one of the methods 800, 900 may be relevant to the other method. Discussion of various techniques and concepts regarding one of the methods 800, 900 and/or other method may be applicable to one of the other methods, although the scope of embodiments is not limited in this respect.

The methods 800, 900 and other methods described herein may refer to APs 102, STAs 103 and/or EDMG STAs 104 operating in accordance with WLAN standards, 802.11 standards and/or other standards. However, embodiments are not limited to performance of those methods by those components, and may also be performed by other devices, such as an Evolved Node-B (eNB), User Equipment (UE) and/or other. In addition, the methods 800, 900 and other methods described herein may be practiced by wireless devices configured to operate in other suitable types of wireless communication systems, including systems configured to operate according to Third Generation Partnership Project (3GPP) standards, 3GPP Long Term Evolution (LTE) standards, 5G standards, New Radio (NR) standards and/or other standards.

In some embodiments, the methods 800, 900 may also be applicable to an apparatus of an EDMG STA 104, an apparatus of an STA 103, an apparatus of an AP 102 and/or an apparatus of another device described above. In some embodiments, an apparatus of an EDMG STA 104 may perform one or more operations of the method 800 and/or other operation(s). In some embodiments, an apparatus of an STA 103 may perform one or more operations of the method 800 and/or other operation(s). In some embodiments, an apparatus of an AP 102 may perform one or more operations of the method 900 and/or other operation(s).

It should also be noted that embodiments are not limited by references herein (such as in descriptions of the methods 800, 900 and/or other descriptions herein) to transmission, reception and/or exchanging of elements such as frames, messages, requests, indicators, signals or other elements. In some embodiments, such an element may be generated, encoded or otherwise processed by processing circuitry (such as by a baseband processor included in the processing circuitry) for transmission. The transmission may be performed by a transceiver or other component, in some cases. In some embodiments, such an element may be decoded, detected or otherwise processed by the processing circuitry (such as by the baseband processor). The element may be received by a transceiver or other component, in some cases. In some embodiments, the processing circuitry and the transceiver may be included in a same apparatus. The scope of embodiments is not limited in this respect, however, as the transceiver may be separate from the apparatus that comprises the processing circuitry, in some embodiments.

One or more of the elements (such as messages, operations and/or other) described herein may be included in a standard and/or protocol, including but not limited to WLAN, IEEE 802.11, IEEE 802.11ay and/or other. The scope of embodiments is not limited to usage of elements that are included in standards, however.

In some embodiments, the EDMG STA 104 may be arranged to operate in accordance with a millimeter wave (mmWave) distribution network arrangement. In some embodiments, the AP 102 may be arranged to operate in accordance with a millimeter wave (mmWave) distribution network arrangement.

At operation 805, the EDMG STA 104 may receive a Link Measurement Request Frame. In some embodiments, the EDMG STA 104 may receive the Link Measurement Request Frame from the AP 102, although the scope of embodiments is not limited in this respect. In some embodiments, the Link Measurement Request Frame may include a request for information for time division duplexing (TDD) rate adaptation. In some embodiments, additional information may also be included in the Link Measurement Request Frame.

The Link Measurement Request Frame may be included in a WLAN standard, 802.11 standard, 802.11ay standard and/or other standard, although the scope of embodiments is not limited in this respect. Embodiments are not limited to usage of the Link Measurement Request Frame in this operation, as any suitable message, frame and/or element (including but not limited a message, frame and/or element described herein) may be used. For instance, the EDMG STA 104 may receive another frame that includes some information that is similar to some information included in the Link Measurement Request Frame as described herein, in some embodiments.

At operation 810, the EDMG STA 104 may transmit a Link Measurement Response Frame. In some embodiments, the EDMG STA 104 may transmit the Link Measurement Response Frame to the AP 102, although the scope of embodiments is not limited in this respect. In some embodiments, the EDMG STA 104 may encode the Link Measurement Response Frame to include a Directional Multi Gigabit (DMG) Link Margin element. In some embodiments, the DMG Link Margin element may indicate the information for the TDD rate adaptation.

In some embodiments, the DMG Link Margin element may include a Rate Adaption Control parameter. In some embodiments, the Rate Adaptation Control parameter may indicate one or more of: a number of space time streams (STSs) for which information is included in the DMG Link Margin element; whether the DMG Link Margin element includes the one or more optional fields; and/or other.

In some embodiments, the DMG Link Margin element may be configurable to include one or more optional fields for the TDD rate adaptation and transmit power control. In some embodiments, the optional fields may include one or more of: a Parameters Across receive (RX) chains field, a Parameters Across Physical Layer Convergence Procedure Protocol Data Units (PPDUs) field, a Parameters Across Low Density Parity Check (LDPC) Codewords field, a Parameters Across Single Carrier (SC) Blocks or Orthogonal Frequency Division Multiplexing (OFDM) Symbols field, an EDMG TPC field and/or other.

In some embodiments, the Parameters Across PPDUs field may include, for each of the STSs for which information is included in the DMG Link Margin element, one or more of: a signal-to-noise ratio (SNR), a modulation and coding scheme (MCS), a link margin and/or other. In some embodiments, the Rate Adaptation Control Parameter may further indicate a number of PPDUs used to determine the SNR.

In some embodiments, the Parameters Across LDPC Codewords field may include, for each of the STSs for which information is included in the DMG Link Margin element, one or more of: an average number of iterations used for LDPC decoding by the EDMG STA; a maximum number of iterations used for the LDPC decoding; a number of LDPC codewords for which a syndrome computed in the LDPC decoding is non-zero; and a number of LDPC codewords used to determine the average number of iterations, the maximum number of iterations, and the number of LDPC codewords for which the syndrome computed in the LDPC decoding is non-zero; and/or other.

In some embodiments, the Parameters Across SC Blocks or OFDM Symbols field may include, for each of the STSs for which information is included in the DMG Link Margin element, one or more of: an average error vector magnitude (EVM) of SC data symbols or OFDM data subcarriers averaged, for a same modulation and a same MCS, across PPDUs and across SC blocks or OFDM symbols; a number of SC blocks or OFDM symbols used to determine the average EVM; and/or other.

In some embodiments, the DMG Link Margin element may include a modulation and coding scheme (MCS). In some embodiments, the Rate Adaptation Control parameter may further include one or more of: an IsEDMG field that indicates whether the MCS is related to Enhanced DMG (EDMG) operation or non-EDMG operation; an IsSC field that indicates whether the MCS is related to SC operation or OFDM operation; and/or other.

In some embodiments, the DMG Link Margin element may include additional information.

The Link Measurement Response Frame may be included in a WLAN standard, 802.11 standard, 802.11ay standard and/or other standard, although the scope of embodiments is not limited in this respect. Embodiments are not limited to usage of the Link Measurement Response Frame in this operation, as any suitable message, frame and/or element (including but not limited a message, frame and/or element described herein) may be used. Embodiments are not limited to usage of the DMG Link Margin element in this operation, as any suitable message, frame and/or element (including but not limited a message, frame and/or element described herein) may be used.

At operation 815, the EDMG STA 104 may attempt to detect a reset condition. At operation 820, the EDMG STA 104 may reset one or more parameter values. In some embodiments, the EDMG STA 104 may reset the one or more parameter values in response to one or more detected reset conditions, although the scope of embodiments is not limited in this respect.

In a non-limiting example, the EDMG STA 104 may detect the reset condition based on one or more of: a change of modulation, MCS, constellation, LDPC mode, guard interval (GI)/cyclic prefix (CP) mode, multiple-input multiple-output (MIMO) mode, MIMO rank, or MIMO type; an end of a reporting period; and/or other. If the reset condition is detected, the EDMG STA 104 may reset values of one or more parameters included in the Parameters Across LDPC Codewords field. Those parameters may include, but are not limited to: the average number of iterations; the maximum number of iterations; the number of LDPC codewords for which a syndrome computed in the LDPC decoding is non-zero; and the number of LDPC codewords used to determine the average number of iterations, the maximum number of iterations, and the number of LDPC codewords for which the syndrome computed in the LDPC decoding is non-zero; and/or other.

In another non-limiting example, the EDMG STA 104 may detect the reset condition based on one or more of: a change of modulation, MCS, constellation, LDPC mode, guard interval (GI)/cyclic prefix (CP) mode, multiple-input multiple-output (MIMO) mode, MIMO rank, or MIMO type; an end of a reporting period; and/or other. If the reset condition is detected, the EDMG STA 104 may reset values of one or more parameters included in the Parameters Across SC Blocks or OFDM Symbols field. Those parameters may include, but are not limited to: the average EVM; the number of SC blocks or OFDM symbols used to determine the average EVM; and/or other.

At operation 825, the EDMG STA 104 may transmit an Announce Frame that comprises a Time Division Duplexing (TDD) Bandwidth Request element. In some embodiments, the EDMG STA 104 may transmit the Announce Frame to the AP 102, although the scope of embodiments is not limited in this respect. The TDD Bandwidth Request element may be included in a WLAN standard, 802.11 standard, 802.11ay standard and/or other standard, although the scope of embodiments is not limited in this respect. Embodiments are not limited to usage of the TDD Bandwidth Request element in this operation, as any suitable message, frame and/or element (including but not limited a message, frame and/or element described herein) may be used. The Announce Frame may be included in a WLAN standard, 802.11 standard, 802.11ay standard and/or other standard, although the scope of embodiments is not limited in this respect. Embodiments are not limited to usage of the Announce Frame in this operation, as any suitable message, frame and/or element (including but not limited a message, frame and/or element described herein) may be used.

In some embodiments, an Announce Frame may be used, by the EDMG STA 104, for "keep alive" functionality. For instance, the EDMG STA 104 may transmit the Announce Frame to indicate, to the AP 102, that the EDMG STA 104 still intends to communicate with the AP 102 and/or other devices. The scope of embodiments are not limited to usage of the Announce Frame for keep alive functionality, however, as the Announce Frame may be used for other purposes.

At operation 830, the EDMG STA 104 may encode an uplink data frame in accordance with one or more of the fields included in the TDD Bandwidth Request element. In some embodiments, the EDMG STA 104 may transmit the uplink data frame to the AP 102, although the scope of embodiments is not limited in this respect.

At operation 835, the EDMG STA 104 may receive one or more Announce Frames that indicate scheduling information for time division duplexing (TDD) operation. In some embodiments, the EDMG STA 104 may receive the one or more Announce Frames from the AP 102, although the scope of embodiments is not limited in this respect. Embodiments are not limited to usage of the Announce Frame in this operation, as any suitable message, frame and/or element (including but not limited a message, frame and/or element described herein) may be used. For instance, the EDMG STA 104 may receive other frame(s) that indicate the scheduling information.

In some embodiments, the EDMG STA 104 may encode, for transmission, an Announce Frame comprising a Time Division Duplexing (TDD) Bandwidth Request element to indicate a bandwidth reservation request for uplink transmissions by the EDMG STA 104 during one or more scheduling periods (SPs). Embodiments are not limited to usage of the Announce Frame or to usage of the TDD Bandwidth Request element, as any suitable messages, frames and/or elements (including but not limited messages, frames and/or elements described herein) may be used. The TDD Bandwidth Request element may indicate one or more of: a Transmit Modulation and Coding Scheme (MCS) field that indicates a recommended MCS for the uplink transmissions; a Requested TX Percentage field that indicates a requested percentage of airtime for the uplink transmissions; a Number of Queue Parameters field that indicates a number of Queue Parameters subfields included in the TDD Bandwidth Request element; one or more Queue Parameters subfields; and/or other. Each of the one or more Queue Parameters subfields may include one or more of: a Queue Size subfield that indicates a size of queued traffic at the EDMG STA; a Traffic Arrival Rate subfield that indicates an arrival rate of traffic at the EDMG STA 104 since a previous reporting event; and/or other. The EDMG STA 104 may encode, for transmission, an uplink data frame in accordance with one or more of the fields included in the TDD Bandwidth Request element.

In some embodiments, each of the one or more Queue Parameters subfields may further include a Traffic Identifier (TID) field that indicates a TID of a corresponding queue. The Queue Size subfield of each Queue Parameters subfield may indicate a size of queued traffic of the TID of the corresponding queue. The Traffic Arrival Rate subfield of each Queue Parameters subfield may indicate an arrival rate of traffic of the TID of the corresponding queue since the previous reporting event.

In some embodiments, an apparatus of an EDMG STA 104 may comprise memory. The memory may be configurable to store information related to a DMG Link Margin element. The memory may store one or more other elements and the apparatus may use them for performance of one or more operations. The apparatus may include processing circuitry, which may perform one or more operations (including but not limited to operation(s) of the method 800 and/or other methods described herein). The processing circuitry may include a baseband processor. The baseband circuitry and/or the processing circuitry may perform one or more operations described herein, including but not limited to encoding of a Link Measurement Response Frame. The apparatus may include a transceiver to transmit the Link Measurement Response Frame. The transceiver may transmit and/or receive other blocks, messages and/or other elements.

At operation 905, the AP 102 may transmit one or more Announce Frames that indicate scheduling information for time division duplexing (TDD) operation. In some embodiments, the AP 102 may transmit the one or more Announce Frames to an EDMG STA 104 and/or STA 103, although the scope of embodiments is not limited in this respect. Embodiments are not limited to usage of the Announce Frame in this operation, as any suitable message, frame and/or element (including but not limited a message, frame and/or element described herein) may be used.

In some embodiments, the Announce Frame may indicate scheduling information for time division duplexing (TDD) operation in a scheduling period (SP) that includes one or more TDD intervals. Each TDD interval may include one or more TDD slots. Embodiments are not limited to usage of a single scheduling period, as the Announce Frame may indicate scheduling information for TDD operation in one or more scheduling periods, in some embodiments. In some embodiments, the Announce Frame may indicate scheduling information for TDD operation in a plurality of consecutive scheduling periods. One or more of the operations described herein related to a single SP may be extended to multiple SPs, in some embodiments.

In some embodiments, the Announce Frame may include a TDD Slot Schedule element that is configurable to include a Bitmap and Access Type Schedule field. Each Bitmap and Access Type Schedule field may indicate a TDD slot type of a corresponding TDD slot of the SP. In some embodiments, the TDD Slot Schedule element may include a Bitmap and Access Type Schedule field for each of the TDD slots of the SP. Embodiments are not limited to usage of the TDD Slot Schedule element in this operation, as any suitable message, frame and/or element (including but not limited a message, frame and/or element described herein) may be used.

In some embodiments, the TDD slot type may be configurable to indicate that the corresponding TDD slot is unassigned, indicating to STAs 103 and/or EDMG STAs 104 to refrain from transmission in unassigned TDD slots. In some embodiments, the TDD slot type may be further configurable to indicate whether the corresponding TDD slot is a transmit (TX) slot or a receive (RX) slot. In some embodiments, a TDD slot that is a TX slot is to be used by an STA 103 and/or EDMG STA 104 for transmission. In some embodiments, a TDD slot that is an RX slot is to be used by an STA 103 and/or EDMG STA 104 for reception. In some embodiments, a TDD slot that is a TX slot may be used by an STA 103 and/or EDMG STA 104 for transmission. In some embodiments, a TDD slot that is an RX slot may be used by an STA 103 and/or EDMG STA 104 for reception. In some embodiments, the TDD slot type may indicate whether a TDD slot is a TX slot or an RX slot from the perspective of a corresponding STA 103 and/or EDMG STA 104.

In some embodiments, the TDD slot type may be further configurable to indicate whether the corresponding TDD slot is unavailable. An unavailable TDD slot may indicate, to STAs 103 and/or EDMG STAs 104, to refrain from transmission in the corresponding TDD slot. The unavailable TDD slot may further indicate, to other APs 102, to refrain from scheduling transmission or reception in the corresponding TDD slots.

In some embodiments, the indication that the corresponding TDD slot is unavailable may be for reservation of the corresponding TDD slot by the AP 102.

At operation 910, the AP 102 may reserve one or more slots. At operation 915, the AP 102 may determine whether to allocate the one or more reserved slots. In some embodiments, an indication that the corresponding TDD slot is unavailable may reserve the corresponding TDD slot for the AP 102.

At operation 920, the AP 102 may transmit one or more additional Announce Frames that indicate scheduling information for the TDD operation. In some embodiments, the AP 102 may transmit the one or more additional Announce Frames to an EDMG STA 104 and/or STA 103, although the scope of embodiments is not limited in this respect. Embodiments are not limited to usage of the Announce Frame in this operation, as any suitable message, frame and/or element (including but not limited a message, frame and/or element described herein) may be used.

In a non-limiting example, the AP 102 may transmit a first Announce Frame that may indicate, for a TDD slot, a first TDD slot type. The AP 102 may encode the first TDD slot type to indicate that the corresponding TDD slot is unavailable. The indication that the corresponding TDD slot is unavailable may reserve the corresponding TDD slot for the AP 102. After the corresponding TDD slot is reserved for the AP 102, the AP 102 may determine whether the corresponding TDD slot is to be used as a TX slot or as an RX slot. The AP 102 may transmit a second Announce Frame that includes a second TDD slot type that indicates whether the corresponding TDD slot is to be used as a TX slot or as an RX slot.

At operation 925, the AP 102 may transmit a Link Measurement Request Frame. In some embodiments, the AP 102 may transmit the Link Measurement Request Frame to the EDMG STA 104 and/or STA 103, although the scope of embodiments is not limited in this respect. Embodiments are not limited to usage of the Link Measurement Request Frame in this operation, as any suitable message, frame and/or element (including but not limited a message, frame and/or element described herein) may be used.

At operation 930, the AP 102 may receive a Link Measurement Response Frame. In some embodiments, the AP 102 may receive the Link Measurement Response Frame from the EDMG STA 104 and/or STA 103, although the scope of embodiments is not limited in this respect. Embodiments are not limited to usage of the Link Measurement Response Frame in this operation, as any suitable message, frame and/or element (including but not limited a message, frame and/or element described herein) may be used.

At operation 935, the AP 102 may receive an Announce Frame that comprises a Time Division Duplexing (TDD) Bandwidth Request element. In some embodiments, the AP 102 may receive the Announce Frame from the EDMG STA 104 and/or STA 103, although the scope of embodiments is not limited in this respect. Embodiments are not limited to usage of the Announce Frame in this operation, as any suitable message, frame and/or element (including but not limited a message, frame and/or element described herein) may be used. Embodiments are not limited to usage of the TDD Bandwidth Request element in this operation, as any suitable message, frame and/or element (including but not limited a message, frame and/or element described herein) may be used.

At operation 940, the AP 102 may decode an uplink data frame in accordance with one or more of the fields included in the TDD Bandwidth Request element. In some embodiments, the AP 102 may receive the uplink data frame from the EDMG STA 104 and/or STA 103, although the scope of embodiments is not limited in this respect.

In some embodiments, an apparatus of an AP 102 may comprise memory. The memory may be configurable to store information related to an Announce Frame. The memory may store one or more other elements and the apparatus may use them for performance of one or more operations. The apparatus may include processing circuitry, which may perform one or more operations (including but not limited to operation(s) of the method 900 and/or other methods described herein). The processing circuitry may include a baseband processor. The baseband circuitry and/or the processing circuitry may perform one or more operations described herein, including but not limited to encoding of an Announce Frame. The apparatus may include a transceiver to transmit the Announce Frame. The transceiver may transmit and/or receive other blocks, messages and/or other element.

It should be noted that some elements described herein and/or illustrated in the tables below (such as parameters, fields, subfields and/or other elements) may illustrate some or all of the concepts and techniques described herein in some cases, but embodiments are not limited by the examples. For instance, embodiments are not limited by the name, number, type, size, ordering, arrangement and/or other aspects of such elements. Although some of those elements may be included in a 3GPP LTE standard, 5G standard, NR standard and/or other standard, embodiments are not limited to usage of elements that are included in standard.

In some cases, an mmWave distribution network may be used. Such cases may include, but are not limited to, cases in which an 802.11ay protocol, 802.11 protocol, WLAN protocol and/or related protocol is used. In some embodiments, an mmWave distribution network use case may be different from other use cases in some aspects, while some existing management frames (such as frames from an 802.11ay protocol) may be applied to the mmWave distribution network use case. In some embodiments, one or more new management frames may be used in an mmWave distribution network use case. One or more of the operations, techniques and/or methods described herein may be applicable to cases in which an 802.11ay protocol is used, although the scope of embodiments is not limited in this respect. One or more of the operations, techniques and/or methods described herein may be applicable to cases in which one or more other protocols are used.

In some embodiments, a management frame in an mmWave distribution network may be based at least partly on an Announce frame used in a protocol such as 802.11ad, 802.11ay and/or other, although the scope of embodiments is not limited in this respect. In some embodiments, one or more information elements may be included in the Announce frames to serve management functions in mmWave distribution networks.

In some embodiments, a TDD slot type in a TDD Slot Schedule element may indicate "unavailable" and/or similar to serve as a slot assignment function in Heartbeat and slot reservation in some messages. In some embodiments, slot assignment information carried in a message may be used for bandwidth reservation, rather than bandwidth allocation. In some embodiments, a slot type in a TDD Slot Schedule element may indicate that this slot is unavailable. In some embodiments, a value (including but not limited to a reserved value) of a Bitmap and Access Type Schedule field within a TDD Slot Schedule element may be used for such an indication. In a non-limiting example, a value of "11" may be used. Embodiments are not limited to usage of the value of "11," as any suitable value may be used.

In some embodiments, a DMG Link Margin element may include one or more information fields described below. In some embodiments, inclusion of one or more of those fields may be optional. In some embodiments, one or more of those fields may be used for TDD rate adaptation, although the scope of embodiments is not limited in this respect. One or more of those fields may be used for additional purpose(s), in addition to or instead of TDD rate adaptation, in some embodiments.

The tables below illustrate a non-limiting example format of a DMG Link Margin element and non-limiting example formats of some fields that may be included in the DMG Link Margin element. In some embodiments, the DMG Link Margin element and/or fields of the DMG Link Margin element may not necessarily include all fields and/or parameters shown in the tables below. In some embodiments, one or more additional fields and/or parameters may be included in the DMG Link Margin element and/or fields of the DMG Link Margin element. In some embodiments, one or more similar fields, related fields, similar parameters and/or related parameters may be included in the DMG Link Margin element and/or fields of the DMG Link Margin element. Embodiments are not limited to the size, type, name, order and/or other aspects of the fields and/or parameters of the DMG Link Margin element and/or fields shown in the tables below.

The table below illustrates a non-limiting example format of a DMG Link Margin element.

| Fields | Octets | Note |
| --- | --- | --- |
| Element ID | 1 | |
| Length | 1 | |
| Activity | 1 | |
| MCS | 1 | |
| Link Margin | 1 | |
| SNR | 1 | |
| Reference Timestamp | 4 | |
| Rate Adaptation Control | 2 | Contains the number of entries reported (NER) and indications of whether the element includes optional fields used for rate adaptation. |
| Parameters Across PPDUs | 0 or 3*NER | Optionally present. If present, contains the subfields of parameters across PPDUs. |
| Parameters Across LDPC Codewords | 0 or 8*NER | Optionally present. If present, contains the subfields of parameters across LDPC codewords. |
| Parameters Across Blocks/Symbols | 0 or 4*NER | Optionally present. If present, contains the subfields of parameters across SC blocks or OFDM symbols. |

The table below illustrates a non-limiting example format of a Rate Adaptation Control field.

| Subfields | Bits | Note |
| --- | --- | --- |
| Number of Entries Reported (NER) | 3 | The value of this subfield plus one indicates the number of entries being reported. The entries are indexed (1 to 8) and represent space time streams. If the value of this field is greater than 1, the MCS, Link Margin and SNR fields are reserved. |
| Indication for Parameters Across PPDUs | 1 | Set to 1 if the DMG Link Margin element contains the "Parameters Across PPDUs" field. Set to 0 otherwise. |
| Indication for Parameters Across LDPC Codewords | 1 | Set to 1 if the DMG Link Margin element contains the "Parameters Across LDPC Codewords" field. Set to 0 otherwise. |
| Indication for Parameters Across SC Blocks or OFDM Symbols | 1 | Set to 1 if the DMG Link Margin element contains the "Parameters Across SC Blocks/Symbols" field. Set to 0 otherwise. |
| IsEDMG | 1 | EDMG (1) or non-EDMG (0). Used to differentiate MCS field. |
| IsSC | 1 | SC (1) or OFDM (0). Used to differentiate MCS field. |
| Reserved | 8 | |

The table below illustrates a non-limiting example format of a Parameters Across PPDUs field.

| Subfields | Bits | Note |
| --- | --- | --- |
| RSSI | 8 | RSSI for the RF chain, as defined in 30.2.2 |
| SNR per STS | 8 | SNR for the space time stream, as defined in Table 54 (D1.0) |
| Number of PPDUs | 8 | Number of PPDUs used to over which the RSSI and SNR measurement were taken |

The table below illustrates a non-limiting example format of a Parameters Across LDPC Codewords field.

| Subfields | Bits | Note |
| --- | --- | --- |
| Average Iterations | 8 | Average number of iterations used by the LDPC decoder for DPHY. One iteration includes processing of all rows. Value quantized to 0.1, range 0.0 to +25.5. Reset when Reset condition met. |
| Max Iterations | 8 | Maximum number of iterations used by the LDPC decoder for DPHY. One iteration includes processing of all rows. Value of integer, range 0 to +255. Reset when Reset condition met. |
| Nonzero Syndromes | 24 | Number of DPHY LDPC codewords with nonzero Syndrome. Reset when Reset condition met. |
| Number of LDPC Codewords | 24 | Number of DPHY LDPC codewords processed and included in the Average Iterations, Max Iterations and Nonzero Syndromes statistics. Reset when Reset condition met. Value 0 means not applicable. |

The table below illustrates a non-limiting example format of a Parameters Across Blocks/Symbols field.

| Subfields | Bits | |
| --- | --- | --- |
| EVM | 8 | Indicates the average EVM in dB of the SC data symbols or OFDM data subcarriers, averaged across all PPDUs and SC blocks or OFDM symbols, having same modulation and MCS. Value quantized to 0.2 dB, range −5.0 to +46.0 dB. Reset when Reset condition met. |
| Number of SC Blocks or OFDM Symbols | 24 | Count of the SC Blocks or OFDM Symbols included in the average EVM value. Value is saturated to 224-1 if overflows. Reset when Reset condition met. Value 0 means not applicable. |

In some embodiments, a reset condition may be based on one or more of the following: a change of: modulation (SC/OFDM), MCS, Constellation, LDPC mode, GI/CP mode, MIMO rank, MIMO type and/or other; an end of a reporting period; and/or other.

In some embodiments, a TDD Bandwidth Request element may include and/or carry information fields for bandwidth reservation request included in UL BW Request messages and/or other messages. The tables below illustrate: a non-limiting example format of a TDD Bandwidth Request element; and a non-limiting example format of a Queue Parameters subfield that may be included in the TDD Bandwidth Request element. In some embodiments, the TDD Bandwidth Request element and/or Queue Parameters subfield may not necessarily include all fields and/or parameters shown in the tables below. In some embodiments, one or more additional fields and/or parameters may be included in the TDD Bandwidth Request element and/or Queue Parameters subfield. In some embodiments, one or more similar fields, related fields, similar parameters and/or related parameters may be included in the TDD Bandwidth Request element and/or Queue Parameters subfield. Embodiments are not limited to the size, type, name, order and/or other aspects of the fields and/or parameters of the TDD Bandwidth Request element and/or Queue Parameters subfield shown in the tables below.

The table below illustrates a non-limiting example format of a TDD Bandwidth Request element.

| Subfields | Bits | Note |
| --- | --- | --- |
| Element ID | 8 | |
| Length | 8 | |
| Element ID Extension | 8 | |
| Transmit MCS | 8 | Recommended MCS value for STA to AP transmission |
| Requested Tx Percentage | 16 | In unit of 0.01 percent |
| Number of Queue Parameters | 5 | Defines the number, N, of subsequent Queue Params subfields. |
| Reserved | 3 | |
| Queue Parameters 1 | 72 | |
| ... | | |
| Queue Parameters i | 72 | $1 \leq i \leq N$ |

The table below illustrates a non-limiting example format of a Queue Parameters subfield.

| Subfields | Bits | Note |
| --- | --- | --- |
| TID | 5 | For values from 0 to 15, indicates the TID corresponding to the queue. Value 31 indicates that this field is not applicable. Other values are reserved. |
| Queue Size | 32 | In units of bytes |
| Traffic Arrival Rate | 32 | Arrival rate since the last reporting event. In units of 1 Kbps. |
| Reserved | 3 | |

In Example 1, an apparatus of an enhanced directional multi-gigabit (EDMG) station (STA) may comprise memory. The apparatus may further comprise processing circuitry. The processing circuitry may be configured to decode a Link Measurement Request Frame received from an access point (AP). The Link Measurement Request Frame may include a request for information for time division duplexing (TDD) rate adaptation. The processing circuitry may be further configured to encode a Link Measurement Response Frame for transmission. The Link Measurement Response Frame may include a Directional Multi Gigabit (DMG) Link Margin element to indicate the information for the TDD rate adaptation. The DMG Link Margin element may include a Rate Adaption Control parameter. The DMG Link Margin element may be configurable to include one or more optional fields for the TDD rate adaptation and transmit power control. The Rate Adaptation Control parameter may indicate: a number of space time streams (STSs) for which information is included in the DMG Link Margin element, and whether the DMG Link Margin element includes the one or more optional fields.

In Example 2, the subject matter of Example 1, wherein the optional fields may include: a Parameters Across receive (RX) chains field, a Parameters Across Physical Layer Convergence Procedure Protocol Data Units (PPDUs) field, a Parameters Across Low Density Parity Check (LDPC) Codewords field, a Parameters Across Single Carrier (SC) Blocks or Orthogonal Frequency Division Multiplexing (OFDM) Symbols field, and an EDMG TPC field.

In Example 3, the subject matter of one or any combination of Examples 1-2, wherein the Parameters Across PPDUs field may include, for each of the STSs for which information is included in the DMG Link Margin element: a signal-to-noise ratio (SNR), a modulation and coding scheme (MCS), and a link margin.

In Example 4, the subject matter of one or any combination of Examples 1-3, wherein the Rate Adaptation Control Parameter may further indicate a number of PPDUs used to determine the SNR.

In Example 5, the subject matter of one or any combination of Examples 1-4, wherein the Parameters Across LDPC Codewords field may include, for each of the STSs for which information is included in the DMG Link Margin element: an average number of iterations used for LDPC decoding by the EDMG STA; a maximum number of iterations used for the LDPC decoding; a number of LDPC codewords for which a syndrome computed in the LDPC decoding is non-zero; and a number of LDPC codewords used to determine the average number of iterations, the maximum number of iterations, and the number of LDPC codewords for which the syndrome computed in the LDPC decoding is non-zero.

In Example 6, the subject matter of one or any combination of Examples 1-5, wherein the processing circuitry may be further configured to attempt to detect a reset condition that includes: a change of modulation, MCS, constellation, LDPC mode, guard interval (GI)/cyclic prefix (CP) mode, multiple-input multiple-output (MIMO) mode, MIMO rank, or MIMO type; and an end of a reporting period. The processing circuitry may be further configured to, if the reset condition is detected, reset values for: the average number of iterations; the maximum number of iterations; the number of LDPC codewords for which a syndrome computed in the LDPC decoding is non-zero; and the number of LDPC codewords used to determine the average number of iterations, the maximum number of iterations, and the number of LDPC codewords for which the syndrome computed in the LDPC decoding is non-zero.

In Example 7, the subject matter of one or any combination of Examples 1-6, wherein the Parameters Across SC Blocks or OFDM Symbols field may include, for each of the STSs for which information is included in the DMG Link Margin element: an average error vector magnitude (EVM) of SC data symbols or OFDM data subcarriers averaged, for a same modulation and a same MCS, across PPDUs and across SC blocks or OFDM symbols; and a number of SC blocks or OFDM symbols used to determine the average EVM.

In Example 8, the subject matter of one or any combination of Examples 1-7, wherein the processing circuitry may be further configured to attempt to detect a reset condition that includes: a change of modulation, MCS, constellation, LDPC mode, guard interval (GI)/cyclic prefix (CP) mode, multiple-input multiple-output (MIMO) mode, MIMO rank, or MIMO type; and an end of a reporting period. The processing circuitry may be further configured to, if the reset condition is detected, reset values for: the average EVM, and the number of SC blocks or OFDM symbols used to determine the average EVM.

In Example 9, the subject matter of one or any combination of Examples 1-8, wherein the DMG Link Margin element may include a modulation and coding scheme (MCS). The Rate Adaptation Control parameter may further include: an IsEDMG field that indicates whether the MCS is related to Enhanced DMG (EDMG) operation or non-EDMG operation; and an IsSC field that indicates whether the MCS is related to SC operation or OFDM operation.

In Example 10, the subject matter of one or any combination of Examples 1-9, wherein the EDMG STA may be arranged to operate in accordance with a millimeter wave (mmWave) distribution network arrangement.

In Example 11, the subject matter of one or any combination of Examples 1-10, wherein the apparatus may include a transceiver to transmit the DMG Link Margin element. The processing circuitry may include a baseband processor to encode the DMG Link Margin element. The memory may be configured to store at least a portion of the DMG Link Margin element.

In Example 12, a non-transitory computer-readable storage medium may store instructions for execution by processing circuitry of an access point (AP). The operations may configure the processing circuitry to encode, for transmission, an Announce Frame to indicate scheduling information for time division duplexing (TDD) operation in a scheduling period (SP) that includes one or more TDD intervals. Each TDD interval may include one or more TDD slots. The Announce Frame may include a TDD Slot Schedule element that is configurable to include a Bitmap and Access Type Schedule field. Each Bitmap and Access Type Schedule field may indicate a TDD slot type of a corresponding TDD slot of the SP. The TDD slot type may be configurable to indicate: that the corresponding TDD slot is unassigned, indicating to stations (STAs) to refrain from transmission in unassigned TDD slots; whether the corresponding TDD slot is a transmit (TX) slot or a receive (RX) slot; and whether the corresponding TDD slot is unavailable. An unavailable TDD slot may indicate to STAs to refrain from transmission in the corresponding TDD slot and may indicate to other APs to refrain from scheduling transmission or reception in the corresponding TDD slots.

In Example 13, the subject matter of Example 12, wherein an indication that the corresponding TDD slot is unavailable may reserve the corresponding TDD slot for the AP.

In Example 14, the subject matter of one or any combination of Examples 12-13, wherein the Announce Frame is a first Announce Frame, and the TDD slot type is a first TDD slot type. The operations may further configure the processing circuitry to encode the first TDD slot type to indicate that the corresponding TDD slot is unavailable. An indication that the corresponding TDD slot is unavailable may reserve the corresponding TDD slot for the AP. The operations may further configure the processing circuitry to, after the corresponding TDD slot is reserved for the AP, determine whether the corresponding TDD slot is to be used as a TX slot or as an RX slot. The operations may further configure the processing circuitry to encode, for transmission, a second Announce Frame that includes a second TDD slot type that indicates whether the corresponding TDD slot is to be used as a TX slot or as an RX slot.

In Example 15, the subject matter of one or any combination of Examples 12-14, wherein the operations may further configure the processing circuitry to encode the TDD Slot Schedule element to include a Bitmap and Access Type Schedule field for each of the TDD slots of the SP.

In Example 16, the subject matter of one or any combination of Examples 12-15, wherein the operations may further configure the processing circuitry to encode the Announce Frame to indicate scheduling information for time division duplexing (TDD) operation in a plurality of consecutive SPs.

In Example 17, the subject matter of one or any combination of Examples 12-16, wherein an indication that the corresponding TDD slot is unavailable may be for reservation of the corresponding TDD slot by the AP.

In Example 18, the subject matter of one or any combination of Examples 12-17, wherein the AP may be arranged to operate in accordance with a millimeter wave (mmWave) distribution network arrangement.

In Example 19, an apparatus of an enhanced directional multi-gigabit (EDMG) station (STA) may comprise memory. The apparatus may further comprise processing circuitry. The processing circuitry may be configured to encode, for transmission, an Announce Frame comprising a Time Division Duplexing (TDD) Bandwidth Request element to indicate a bandwidth reservation request for uplink transmissions by the EDMG STA during one or more scheduling periods (SPs). The TDD Bandwidth Request element may indicate: a Transmit Modulation and Coding Scheme (MCS) field that indicates a recommended MCS for the uplink transmissions; a Requested TX Percentage field that indicates a requested percentage of airtime for the uplink transmissions; a Number of Queue Parameters field that indicates a number of Queue Parameters subfields included in the TDD Bandwidth Request element; and one or more Queue Parameters subfields. Each of the one or more Queue Parameters subfields may include: a Queue Size subfield that indicates a size of queued traffic at the EDMG STA; and a Traffic Arrival Rate subfield that indicates an arrival rate of traffic at the EDMG STA since a previous reporting event. The processing circuitry may be further configured to encode, for transmission, an uplink data frame in accordance with one or more of the fields included in the TDD Bandwidth Request element.

In Example 20, the subject matter of Example 19, wherein each of the one or more Queue Parameters subfields may further include a Traffic Identifier (TID) field that indicates a TID of a corresponding queue. The Queue Size subfield of each Queue Parameters subfield may indicate a size of queued traffic of the TID of the corresponding queue. The Traffic Arrival Rate subfield of each Queue Parameters subfield may indicate an arrival rate of traffic of the TID of the corresponding queue since the previous reporting event.]

In Example 21, an apparatus of an access point (AP) may comprise means for encoding, for transmission, an Announce Frame to indicate scheduling information for time division duplexing (TDD) operation in a scheduling period (SP) that includes one or more TDD intervals. Each TDD interval may include one or more TDD slots. The Announce Frame may include a TDD Slot Schedule element that is configurable to include a Bitmap and Access Type Schedule field. Each Bitmap and Access Type Schedule field may indicate a TDD slot type of a corresponding TDD slot of the SP. The TDD slot type may be configurable to indicate: that the corresponding TDD slot is unassigned, indicating to stations (STAs) to refrain from transmission in unassigned TDD slots; whether the corresponding TDD slot is a transmit (TX) slot or a receive (RX) slot; and whether the corresponding TDD slot is unavailable. An unavailable TDD slot may indicate to STAs to refrain from transmission in the corresponding TDD slot and may indicate to other APs to refrain from scheduling transmission or reception in the corresponding TDD slots.

In Example 22, the subject matter of Example 21, wherein an indication that the corresponding TDD slot is unavailable may reserve the corresponding TDD slot for the AP.

In Example 23, the subject matter of one or any combination of Examples 21-22, wherein the Announce Frame is a first Announce Frame, and the TDD slot type is a first TDD slot type. The apparatus may further comprise means for encoding the first TDD slot type to indicate that the corresponding TDD slot is unavailable. An indication that the corresponding TDD slot is unavailable may reserve the corresponding TDD slot for the AP. The apparatus may further comprise means for, after the corresponding TDD slot is reserved for the AP, determining whether the corresponding TDD slot is to be used as a TX slot or as an RX slot. The apparatus may further comprise means for encoding, for transmission, a second Announce Frame that includes a second TDD slot type that indicates whether the corresponding TDD slot is to be used as a TX slot or as an RX slot.

In Example 24, the subject matter of one or any combination of Examples 21-23, wherein the apparatus may further comprise means for encoding the TDD Slot Schedule element to include a Bitmap and Access Type Schedule field for each of the TDD slots of the SP.

In Example 25, the subject matter of one or any combination of Examples 21-24, wherein the apparatus may further comprise means for encoding the Announce Frame to indicate scheduling information for time division duplexing (TDD) operation in a plurality of consecutive SPs.

In Example 26, the subject matter of one or any combination of Examples 21-25, wherein an indication that the corresponding TDD slot is unavailable may be for reservation of the corresponding TDD slot by the AP.

In Example 27, the subject matter of one or any combination of Examples 21-26, wherein the AP may be arranged to operate in accordance with a millimeter wave (mmWave) distribution network arrangement.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus of an enhanced directional multi-gigabit (EDMG) station (STA), the apparatus comprising: processing circuitry; and memory, the processing circuitry configured to:
    encode an announce frame for transmission, the announce frame encoded to include a time division duplexing (TDD) slot schedule element, and a TDD bandwidth request element, the Announce Frame to indicate scheduling information for TDD operation in a scheduling period (SP) that includes one or more TDD intervals, wherein each TDD interval includes one or more TDD slots,
    wherein the TDD Slot Schedule element is configurable to include a Bitmap and Access Type Schedule field, the Bitmap and Access Type Schedule field indicating a TDD slot type of a corresponding TDD slot of a service period (SP) and an access permission of the corresponding TDD slot,
    wherein the TDD slot type indicates whether the corresponding TDD slot is unassigned, is a transmit (TX) slot, is a receive (RX) slot, or is unavailable for the EDMG STA,
    wherein processing circuitry is configured to cause the EDMG STA to refrain from transmitting in a TDD slot that is indicated to be either unassigned or unavailable,
    wherein the TDD bandwidth request element is encoded to indicate a bandwidth reservation request for uplink transmissions by the EDMG STA during one or more of the SPs; and
    wherein the processing circuitry is configured to encode, an uplink transmission within a TDD slot of one of the SPs, the TDD slot indicated as a TX slot by the corresponding TDD slot type, the uplink transmission for transmission in accordance with the fields included in the TDD bandwidth request element.

2. The apparatus of claim 1 wherein the announce frame is further encoded to include a DMG link margin element, the DMG link margin element to include one or more optional fields for TDD rate adaptation and transmit power control.

3. The apparatus of claim 1 wherein the TDD bandwidth request element comprises a transmit Modulation and Coding Scheme (MCS) field that indicates a recommended MCS for the uplink transmission.

4. The apparatus of claim 3 wherein the TDD bandwidth request element further comprises:
    a Requested TX Percentage field that indicates a requested percentage of airtime for the uplink transmissions.

5. The apparatus of claim 3 wherein the TDD bandwidth request element further comprises:
    a Number of Queue Parameters field that indicates a number of Queue Parameters subfields that are included in the TDD Bandwidth Request element; and
    one or more Queue Parameters subfields,
    wherein each of the one or more Queue Parameters subfields includes:
    a traffic identifier (TID) subfield; and
    a Queue Size subfield that indicates an amount of queued traffic at the EDMG STA for the TID indicated by the TID subfield.

6. The apparatus of claim 3 wherein each queue parameter field is encoded to include a Traffic Arrival Rate subfield that indicates an arrival rate of traffic at the EDMG STA since a previous reporting event.

7. The apparatus of claim 1 wherein the memory is configured to store the TDD slot schedule element.

8. The apparatus of claim 1 further comprising: mixer circuitry to upconvert baseband signals to RF signals; and
    synthesizer circuitry, the synthesizer circuitry comprising a fractional-N synthesizer or a fractional N/N+1 synthesizer, the synthesizer circuitry configured to generate an output frequency for use by the mixer circuitry,
    wherein the processing circuitry is configured to encode baseband signals, the baseband signals that comprise the announce frame.

9. The apparatus of claim 1 further comprising: mixer circuitry to upconvert baseband signals to RF signals; and
    synthesizer circuitry, the synthesizer circuitry comprising a delta-sigma synthesizer, the synthesizer circuitry configured to generate an output frequency for use by the mixer circuitry,
    wherein the processing circuitry is configured to encode the baseband signals, the baseband signals that comprise the announce frame.

* * * * *